United States Patent
Yadid-Pecht et al.

(10) Patent No.: US 8,280,098 B2
(45) Date of Patent: *Oct. 2, 2012

(54) DIGITAL WATERMARKING CMOS SENSOR

(75) Inventors: Orly Yadid-Pecht, Haifa (IL); Yonatan Shoshan, Calgary (CA); Alexander Fish, Hadera (IL)

(73) Assignee: UTI Limited Partnership, Calgary, Alberta (CA)

( * ) Notice: Subject to any disclaimer, the term of this patent is extended or adjusted under 35 U.S.C. 154(b) by 985 days.

This patent is subject to a terminal disclaimer.

(21) Appl. No.: 12/202,151

(22) Filed: Aug. 29, 2008

(65) Prior Publication Data

US 2009/0141931 A1 Jun. 4, 2009

Related U.S. Application Data

(63) Continuation-in-part of application No. 11/419,183, filed on May 18, 2006, now Pat. No. 7,688,994.

(60) Provisional application No. 60/594,924, filed on May 19, 2005.

(51) Int. Cl.
*G06K 9/00* (2006.01)
*H04N 3/14* (2006.01)
*H04L 9/32* (2006.01)

(52) U.S. Cl. ............... 382/100; 348/308; 713/176

(58) Field of Classification Search ........... 382/100, 382/232, 240; 380/51, 54, 210, 252, 287; 370/522–529; 283/72, 74–81, 85, 93; 358/3.28; 713/176, 179; 348/308, 461, 463

See application file for complete search history.

(56) References Cited

U.S. PATENT DOCUMENTS

| | | | |
|---|---|---|---|
| 5,253,078 A * | 10/1993 | Balkanski et al. | 382/250 |
| 6,388,851 B1 * | 5/2002 | Pettersson | 361/56 |
| 6,573,936 B2 * | 6/2003 | Morris et al. | 348/294 |
| 6,725,372 B1 * | 4/2004 | Lewis et al. | 713/176 |
| 7,409,060 B2 * | 8/2008 | Nomizu et al. | 380/200 |
| 7,463,289 B2 * | 12/2008 | Machida | 348/231.1 |
| 7,511,859 B2 * | 3/2009 | Lim | 358/3.28 |
| 7,522,203 B2 * | 4/2009 | Fabinski et al. | 348/294 |
| 2005/0169499 A1 | 8/2005 | Rodriguez et al. | 382/100 |
| 2005/0271246 A1 * | 12/2005 | Sharma et al. | 382/100 |
| 2007/0019090 A1 | 1/2007 | Yadid-Pecht et al. | 348/308 |

FOREIGN PATENT DOCUMENTS

| | | |
|---|---|---|
| EP | 0 926 897 | 6/1999 |
| EP | 1 215 910 | 6/2002 |

OTHER PUBLICATIONS

Bartolini et al., "Image authentication techniques for surveillance applications," *Proc. IEEE*, 89(10):1403-1418, 2001.

Cox et al., "Watermarking as communications with side information," *Proc. IEEE*, 87(7):1127-1141, 1999.

De Strycker et al., "Implementation of a real-time digital watermarking process for broadcast monitoring on a trimedia VLIW processor," *IEEE Proc.*, 147(4):371-376, 2000.

(Continued)

*Primary Examiner* — Abolfazl Tabatabai
(74) *Attorney, Agent, or Firm* — Fulbright & Jaworski L.L.P.

(57) ABSTRACT

The subject matter of this specification can be implemented in, among other things, an imaging system including an active pixel sensor imaging array configured to capture an image, said imaging array being in electronic communication with a watermark embedder.

40 Claims, 20 Drawing Sheets

OTHER PUBLICATIONS

Fossum, "CMOS image sensors: electronic camera-on-a chip," *IEEE Trans. Electron Devices*, 44(10::1689-1698, 1997.

Friedman, "The trustworthy digital camera: restoring credibility to the photographic image," *IEEE Trans. on Cons. Elec.*, 39(10):905-910, 1993.

Garimella et al., "VLSI implementation of online digital watermarking technique with difference encoding for 8-bit grayscale images," *Proc. 16th Intl. Conf. VLSI Design*, p. 283, 2003.

Mathai, "Hardware implementation perspectives of digital video watermarking algorithms," *IEEE Tarns. Sig. Proc.*, 51(4):925-938, 2003.

Mathai, "VLSI implementation of a real-time video watermarking embedder and detector," *Proc. Intl. Symposium on Circuits and Systems*, 2:772-775, 2003.

Mohanty et al., "VLSI implementation of invisible digital watermarking algorithms towards the development of a secure JPEG encoder," *IEEE Workshop on Signal Processing System*, pp. 183-188, 2003.

Mohanty et al., "VLSI implementation of visible watermarking for a secure digital still camera design," *17th International Conference on VLSI Design*, p. 1063, 2004.

Peticolas et al., "Information hiding—a survey," *Proc. IEEE*, 87(7):1062-1078, 1999.

Shcherback et al., "CMOS APS crosstalk characterization via a unique submicron scanning system," *IEEE Trans. Electron Devices*, 50:1994-1997, 2003.

Tirkel et al., "A unique watermark for every image," *IEEE Multimedia*, 8(4):30-37, 2001.

International Search Report and Written Opinion, issued in Application No. PCT/IB2009/006811, mail date Dec. 1, 2009.

Shoshan, "Hardware implementation of a DCT watermark for CMOS image sensors," *Electronics, Circuits and Systems*, pp. 368-371, 2008.

* cited by examiner

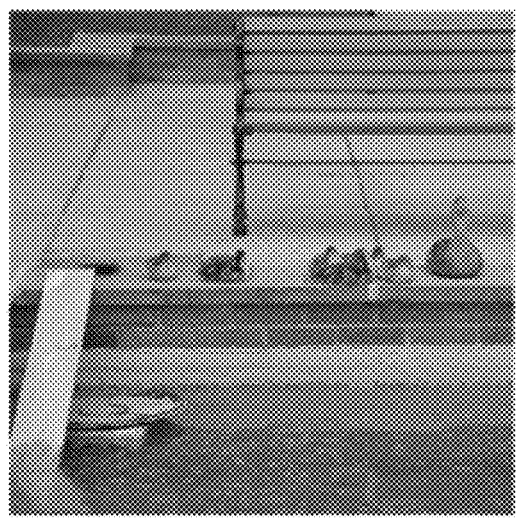
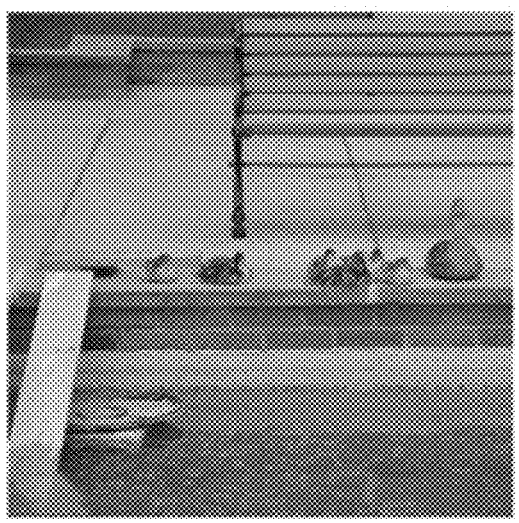
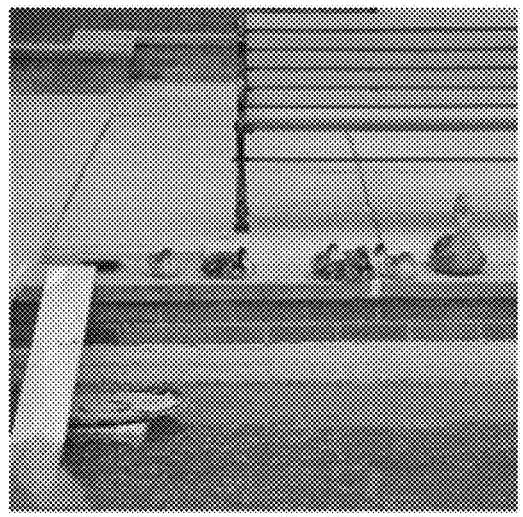
FIG. 1

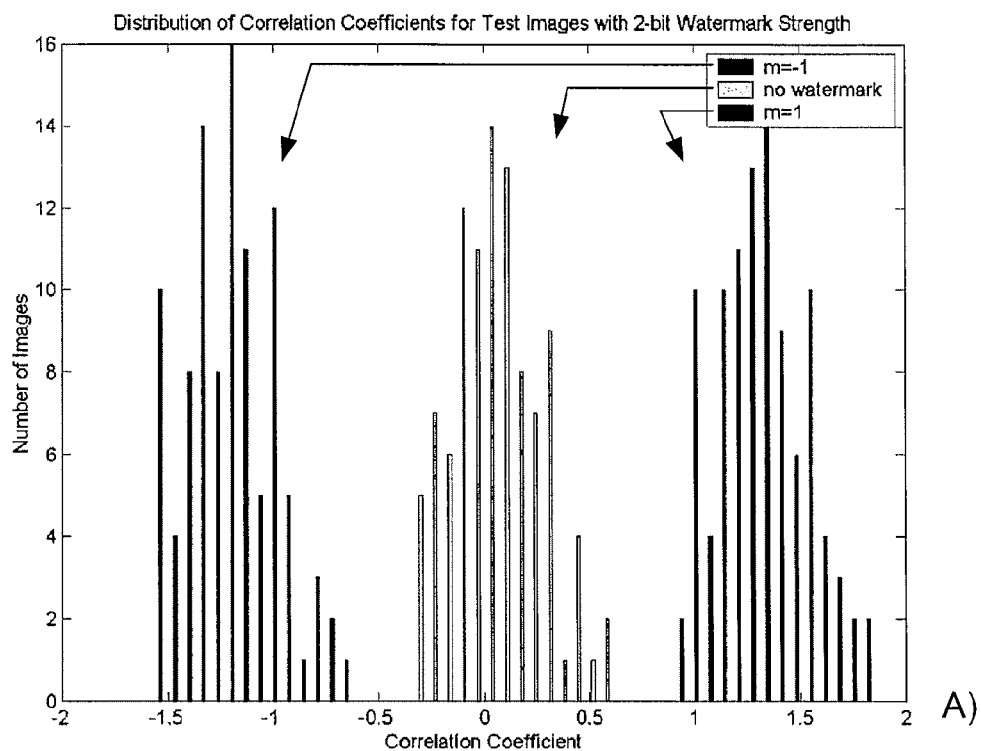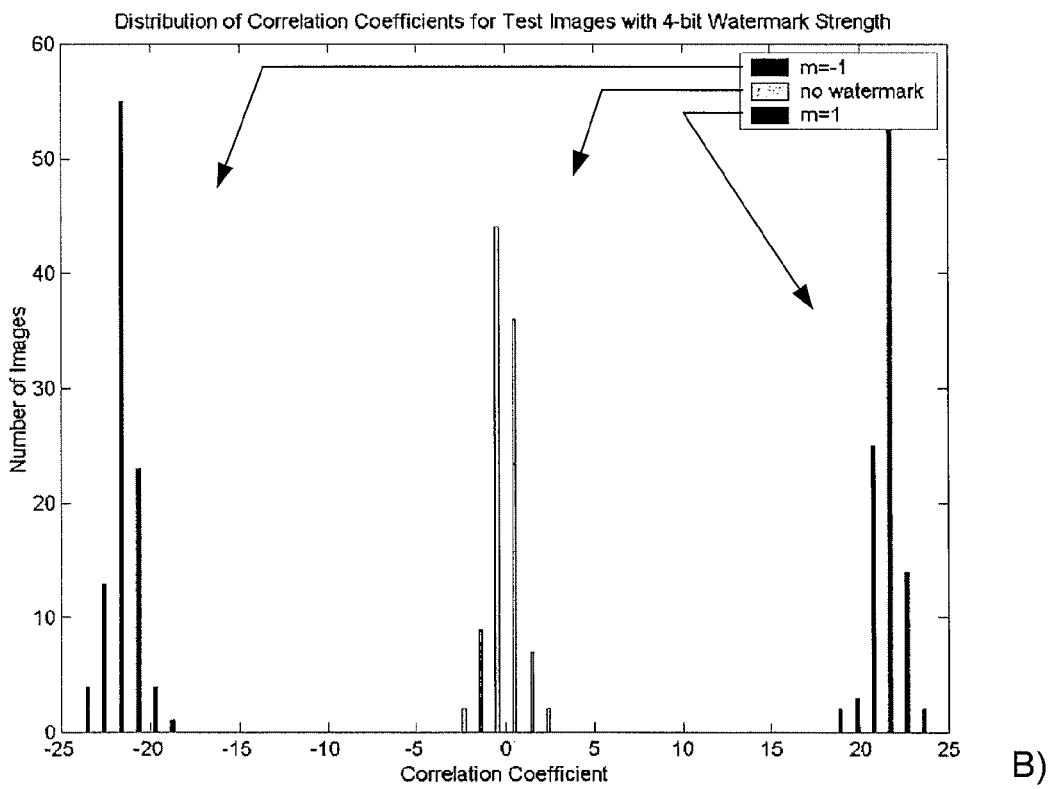
FIG. 2

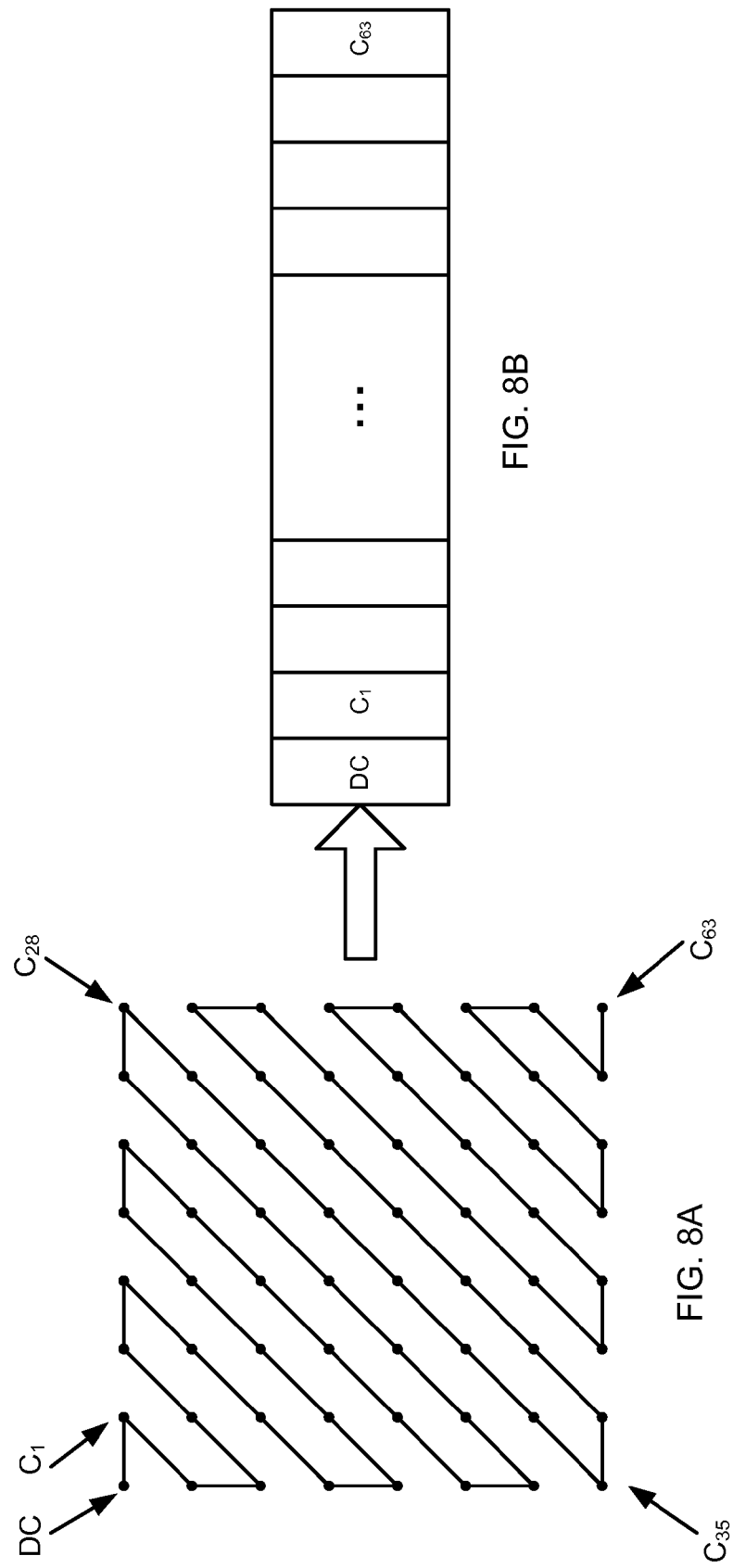

| Compression [%] | N | PSNR [dB] | Detection Ratio [%] |
|---|---|---|---|
| 60.1 | 2 | 44.2 | 82.5 |
| 39.1 | 2 | 38.7 | 72.5 |
| 60.1 | 4 | 43.6 | 95 |
| 39.1 | 4 | 37.9 | 82.5 |

FIG. 16

DIGITAL WATERMARKING CMOS SENSOR

CROSS-REFERENCE TO RELATED APPLICATIONS

The present application is a continuation-in-part and claims priority benefit of U.S. patent application Ser. No. 11/419,183, filed on May 18, 2006, incorporated herein by reference, which application claims priority benefit of U.S. Provisional Patent Application No. 60/594,924 filed on May 19, 2005, incorporated herein by reference.

TECHNICAL FIELD

The present disclosure relates to imaging systems, and in particular, imaging systems for producing images having integral security features.

BACKGROUND

Photographic fraud is a matter of growing concern, owing in part to the availability of sophisticated software platforms that allow users to alter and edit images, leaving little or no evidence of tampering. Digital images may offer some protection because they can include security features, such as watermarks, for verifying authenticity, or preventing unauthorized copying of the image. Some watermark research has been devoted to software-based cryptographic and other security-related theories.

SUMMARY

In general, this document describes a CMOS chip having integral security capabilities. In certain embodiments, the security measures include "watermarking." A first imaging device that includes an image sensor can embed a watermark generated by the CMOS chip in digital image data produced by the sensor. A second device can receive the image data and detect the watermark, allowing unique identification of the sensor itself.

In a first aspect, an imaging system includes an active pixel sensor imaging array configured to capture an image, the imaging array being in electronic communication with a digitizer that digitizes an output of the imaging array. The system further includes a discrete cosine transform circuit in electronic communication with the imaging array that generates coefficients for a block of the digitized array output. The system further includes a quantizer circuit, in electronic communication with the discrete cosine transform circuit, that quantizes the coefficients. The system further includes a watermark generating circuit for generating a digital watermark. The system further includes a watermark embedder circuit, in electronic communication with the discrete cosine transform circuit and the watermark generating circuit that receives a transformed, quantized block of the digitized array output and the digital watermark and produces a watermarked image therefrom. The system further includes an entropy encoder circuit, in electronic communication with the watermark embedder, that receives and encodes the watermarked image, and produces a watermarked image file.

Implementations can include any, all, or none of the following features. The active pixel sensor imaging array can be a CMOS active pixel sensor array. The encoder circuit can be a Huffman encoder circuit. The active pixel sensor imaging array can include an n-well photodiode. The n-well photodiode can have an octagonal layout. The digitizer can include column parallel analog digital converters (ADCs), pixel parallel ADCs, or a single ADC for the active pixel sensor (APS) array. The digitizer can include column parallel ADCs. The watermark generating circuit can be a random number generator and the watermark data can include a stream of pseudorandom bits. The random number generator can be selected from the group consisting of: a linear-feedback shift register, a feedback with carries shift register, and a filtered feedback with carries shift register. The coefficients for the block of the digitized array output represent spatial frequencies in two dimensions. The quantizer circuit can be configured to reduce the spatial frequencies to one dimension. The quantizer circuit can be configured to organize the one-dimensional spatial frequencies in a "zigzag" order. The watermark generating circuit generates a digital watermark dependent on a key. The key can be a secret key. The watermark generating circuit generates a digital watermark dependent on the architecture of the random number generator and the key. The block of the digitized array output consists of eight rows by eight columns. The random number generator can be adapted to produce the stream of pseudorandom bits from an initial state, and can further include means for providing bit values from the ADC to generate the initial state of the random number generator. The discrete cosine transform circuit, the quantizer circuit, the watermark generating circuit, the watermark embedder circuit and the entropy encoder can include a JPEG encoder circuit. The imaging system can be can included in a digital video camera. The digital video camera utilizes a DCT based video compression standard. The digital watermark can be embedded in an "I" frame of a group of pictures.

In a second aspect, a method for embedding a digital watermark includes receiving, at a discrete cosine transform circuit, a digitized output of an active pixel sensor array and generating coefficients for a block of the digitized output. The method further includes receiving the coefficients at a quantizer circuit that generates an output includes transformed, quantized coefficients. The method further includes generating a watermark from a watermark generating circuit. The method further includes generating a watermarked image from a combination of the watermark and the transformed, quantized coefficients at a watermark embedder circuit. The method further includes entropy encoding the watermarked image into a digitized file format.

Implementations can include any, all, or none of the following features. The entropy encoding the watermarked image can include encoding using a Huffman encoder. The active pixel sensor array can be a CMOS active pixel sensor array. The file format can be selected from JPEG, MPEG-2, MPEG-4, H.261, H.262, H.263, and H.264.

In a third aspect, a method for providing an imaging system with built-in watermarking includes combining an image watermarking chip with a circuit board that is in electronic communication with an imaging sensor array. The method further includes wherein the image watermarking chip includes a discrete cosine transform circuit that receives a digitized output of the sensor array and generates coefficients for a block of the digitized array output. The method further includes a quantizer circuit, in electronic communication with the discrete cosine transform circuit, that quantizes the coefficients. The method further includes a watermark generating circuit that generates a digital watermark. The method further includes a watermark embedder circuit that receives the coefficients for a block of the digitized array output and the digital watermark and produces a watermarked image therefrom. The method further includes an encoder circuit, in electronic communication with the watermark embedder, that receives and encodes the watermarked image. The method further includes wherein the image watermarking chip, the circuit board, and the imaging sensor array are configured and operable to cooperatively produce a digitally-watermarked image from an original, un-watermarked image captured by the imaging sensor array.

Implementations can include any, all, or none of the following features. The encoder circuit can include a Huffman encoder. The imaging system can be a digital camera, video recorder, scanner, or other imaging device. The circuit board can be operable to control imaging aspects of the imaging system.

In a fourth aspect, a digital watermarking chip includes a discrete cosine transform circuit that receives a digitized array output and generates coefficients for a block of the digitized array output. The further includes a quantizer circuit, in electronic communication with the discrete cosine transform circuit, that receives the coefficients and generates quantized coefficients therefrom. The digital watermarking chip further includes a watermark generating circuit that generates a digital watermark based on a key. The digital watermarking chip further includes a watermark embedder circuit that receives the quantized coefficients and the digital watermark and produces a watermarked image therefrom. The digital watermarking chip further includes an entropy encoder circuit that receives the watermarked image and encodes the image thereby producing an image file.

Implementations can include any, all, or none of the following features. The entropy encoder circuit can include a Huffman encoder.

In a fifth aspect, an imaging device includes a digital watermarking chip described above.

Implementations can include any, all, or none of the following features. The imaging device can be selected from the group consisting of camera, video recorder, and optical scanner.

In a sixth aspect, a method for authenticating an origin of a digital image includes receiving, at a computing device, an encrypted digital image with embedded digital watermark data provided by an imaging system described above. The method further includes providing an authentication result as a display or a tangible output of the computing device as to whether or not the encrypted digital image originated from the imaging system, by: (a) decrypting the encrypted digital image using a decryption algorithm; and (b) determining whether or not the digital watermark data was embedded using the imaging system by deciphering the embedded digital watermark data in cooperation with a secret key used by the imaging system for embedding the digital watermark data. The method further includes wherein if the deciphering reveals that the digital watermark data was embedded using the secret key the digital image is authentic, and if the deciphering reveals that the digital watermark data was not embedded using the secret key, the digital image is not authentic.

Implementations can include any, all, or none of the following features. The digital image can be a compressed digital image, and step (a) can further include decompressing the image.

In a seventh aspect, a watermark embedder circuit includes a memory buffer configured to receive quantized discrete cosine transform (DCT) image data. The watermark embedder circuit further includes a combination unit module configured to generate a calculated binary value. The watermark embedder circuit further includes wherein the calculated binary value is calculated by combining the quantized DCT image data with a watermark. The calculated binary value has an associated index corresponding to one or more blocks of the quantized DCT data. The combination unit module is in electronic communication with a watermark generator and the memory buffer. The watermark embedder circuit further includes a first register configured to store a first index value and a second index value. The first index value is the highest numerical index value corresponding to a non-zero calculated binary value, and the second index value is less than the first index value. The first register is in electronic communication with the combination unit module. The watermark embedder circuit further includes a second register configured to store a first modification value and a second modification value wherein the second register is in electronic communication with the first register and the combination unit module. The watermark embedder circuit further includes a third register configured to receive a copy of the first index value and the second index value. The watermark embedder circuit further includes wherein the third register is in electronic communication with the first register. The watermark embedder circuit further includes a fourth register configured to receive a copy of the first modification value and the second modification value. The watermark embedder circuit further includes wherein the fourth register is in electronic communication with the second register. The watermark embedder circuit further includes a least significant bit module configured to modify a bit of the DCT image data.

In an eighth aspect, an imaging system includes the imaging system described above and a watermark embedder circuit that includes a memory buffer configured to receive quantized discrete cosine transform (DCT) image data, and a combination unit module configured to generate a calculated binary value. The calculated binary value is calculated by combining said quantized DCT image data with a watermark. The calculated binary value has an associated index corresponding to one or more blocks of the quantized DCT data. The combination unit module is in electronic communication with a watermark generator and the memory buffer. The embedder circuit also includes a first register configured to store a first index value and a second index value, where the first index value is the highest numerical index value corresponding to a non-zero calculated binary value, and the second index value is less than the first index value, wherein the first register is in electronic communication with the combination unit module. The embedder circuit also includes a second register configured to store a first modification value and a second modification value wherein the second register is in electronic communication with the first register and the combination unit module. The embedder circuit also includes a third register configured to receive a copy of the first index value and the second index value, where the third register is in electronic communication with the first register. The embedder circuit also includes a fourth register configured to receive a copy of the first modification value and the second modification value, where the fourth register is in electronic communication with the second register. The embedder circuit also includes a least significant bit module configured to modify a bit of the DCT image data.

In a ninth aspect, a method for embedding a watermark in a second block of image data includes receiving a compression coefficient for the second block of image data. The method further includes storing the compression coefficient for the second block of image data in a memory buffer. The memory buffer includes a compression coefficient for a first block of image data. The method further includes generating a watermark. The method further includes combining the watermark with the compression coefficient for the second block of image data with the compression coefficients for the previous block of the first block of image data. The method further includes generating a calculated binary value. The calculated binary value is used to determine modifications to the second block of image data.

Implementations can include any, all, or none of the following features. The compression coefficients can be DCT coefficients.

In another aspect, a computer program product tangibly embodied in a computer-readable storage medium is provided. The computer program product includes instructions that, when executed, perform operations for authenticating an origin of a digital image, the operations includes receiving, at a computing device, an encrypted digital image with embedded digital watermark data provided by an imaging system described above. The computer program product further includes providing an authentication result as a display or a tangible output of the computing device as to whether or not the encrypted digital image originated from the imaging system, by: (a) decrypting the encrypted digital image using a decryption algorithm; and (b) determining whether or not the digital watermark data was embedded using the imaging system by deciphering the embedded digital watermark data in cooperation with a secret key used by the imaging system for embedding the digital watermark data. The computer program product further includes wherein if the deciphering reveals that the digital watermark data was embedded using the secret key the digital image is authentic, and if the deciphering reveals that the digital watermark data was not embedded using the secret key, the digital image is not authentic.

As used herein, the term "watermarking" refers to digital watermarking and is the process of embedding information into a digital signal. The signal may be pictures or video, for example. If the signal is copied, then the information is also carried in the copy. As used herein, the term "watermark" refers to embedded information in a digital signal.

The details of one or more embodiments are set forth in the accompanying drawings and the description below. Other features, objects, and advantages will be apparent from the description and drawings, and from the claims.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety. In case of conflict, the present specification, including definitions, will control.

DESCRIPTION OF DRAWINGS

FIG. 1 shows digital photos of A) an original 256×256 bitmap, B) the same bitmap with random 2-bit values added to each pixel, and C) the same bitmap with random 4-bit values added to each pixel respectively.

FIG. 2 shows distribution for correlation coefficients for the images shown in FIGS. 1B and 1C.

FIG. 8A is a diagram of exemplary two-dimensional discrete cosine transform coefficients from a block, according to one embodiment.

FIG. 8B is a diagram of exemplary discrete cosine transform coefficients from a block organized in a "zig-zag" order, according to one embodiment.

FIG. 16 is a table showing the tradeoff between image quality and detection ratio, according to one embodiment.

Like reference symbols in the various drawings indicate like elements.

DETAILED DESCRIPTION OF ILLUSTRATIVE EMBODIMENTS

Methods and systems for creating a watermark in a digital image created by a complementary metal-oxide-semiconductor (CMOS) sensor are disclosed. All terms not defined herein have their common art-recognized meanings. To the extent that the following description is of a specific embodiment or a particular use, it is intended to be illustrative only, and not limiting of the claims. The following description is intended to cover all alternatives, modifications and equivalents that are included in the spirit and scope of this disclosure, as defined in the appended claims.

In some embodiments, a digital watermark can be created by combining a pseudo-noise stream of data with digital image data at the chip level. The noise level can be kept low enough such that the combination does not substantially change the image in a perceptible manner, e.g., to the eye of a person viewing the image on a display device such as a computer monitor.

Referring now to FIG. 1, in some cases, a minimal effect on image quality can be seen in images containing a watermark. FIG. 1A is an exemplary original 256×256 bitmap image. FIG. 1B is a modification of the exemplary original 256×256 bitmap image in FIG. 1A that includes the addition of random 2-bit values to each pixel in the image. FIG. 1C is a modification of the exemplary original 256×256 bitmap image in FIG. 1A that includes the addition of random 4-bit values to each pixel. The image quality of the images in FIG. 1B and FIG. 1C compares favorably to the original image in FIG. 1A. Both the images in FIGS. 1B and 1C show little to no visible image quality degradation.

Figure 3:
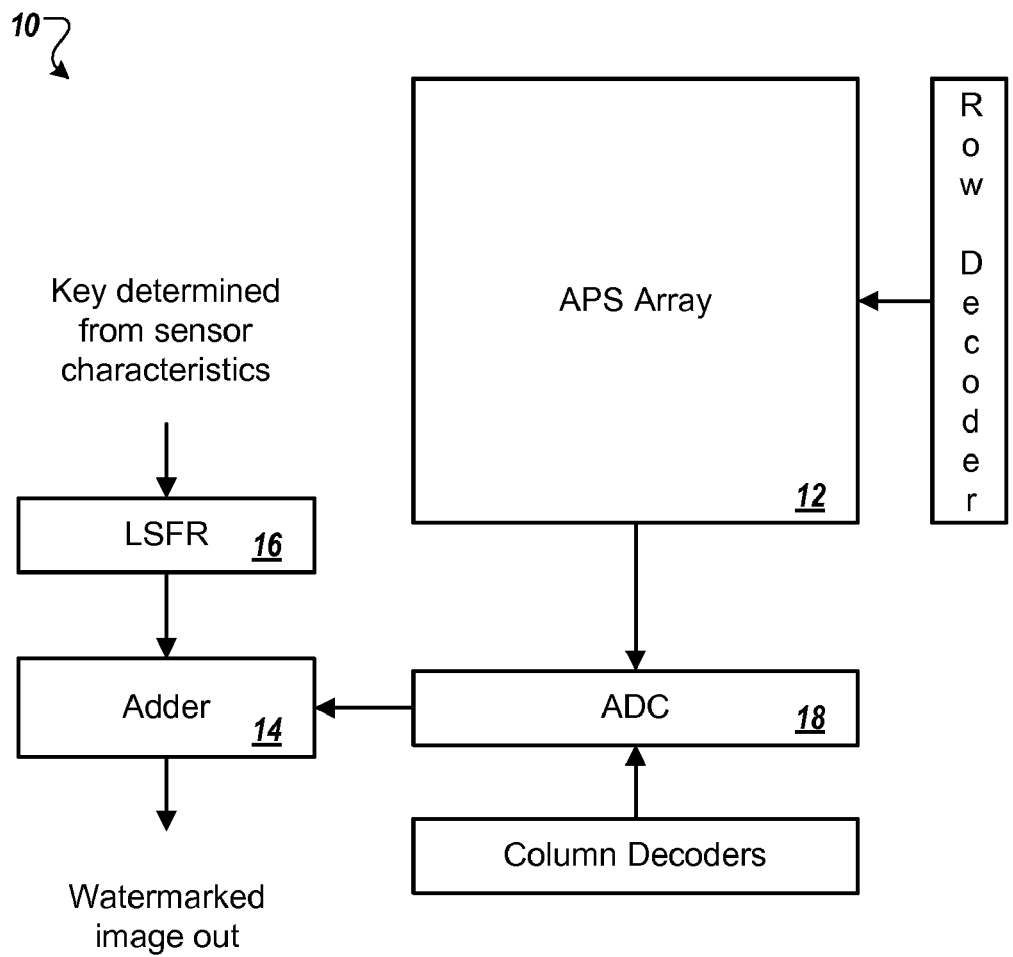
FIG. 3 shows a schematic of one embodiment of the chip architecture.

Referring now to FIG. 3, one embodiment of a watermarking system 10 includes an active pixel sensor (APS) array 12. The APS array 12 can be an image sensor that includes an N×M array of pixel sensors, where N is a number of rows and M is a number of columns. In some cases, the output of the array 12 can be digitized by using, e.g., column parallel analog-to-digital converters 18 (ADCs) and passed to a combination circuit, such as an adder 14. A watermark generation circuit 16 can generate a watermark as a unique bit stream of pixel data based on an input key. The adder 14 can combine the watermark and the output of the analog-to-digital converters 18 to create a watermarked digital image.

Referring to FIG. 3, the output of an APS array (e.g., APS array 12) can be digitized using column parallel analog-to-digital converters 18. In some implementations, the output of an APS array (e.g., APS array 12) can be digitized using pixel parallel analog-to-digital converters. In some implementations, the output of an APS array (e.g., APS array 12) can be digitized using a single analog-to-digital converter for the entire APS array. The mode of digitization is not critical, so long as a digital value is produced. The combination of a digital watermark with digitized array output may be performed using any logical operation, for example, addition, subtraction or masking, although other operations are equally contemplated. In a preferred embodiment, the implementation of the watermark is digital. An alternative embodiment uses an analog watermarking implementation. For example, a random voltage may be combined with the output of an APS array prior to digitization. The random voltage value can be selected to add little to no viewable distortion to the resulting digitized image.

Figure 4:
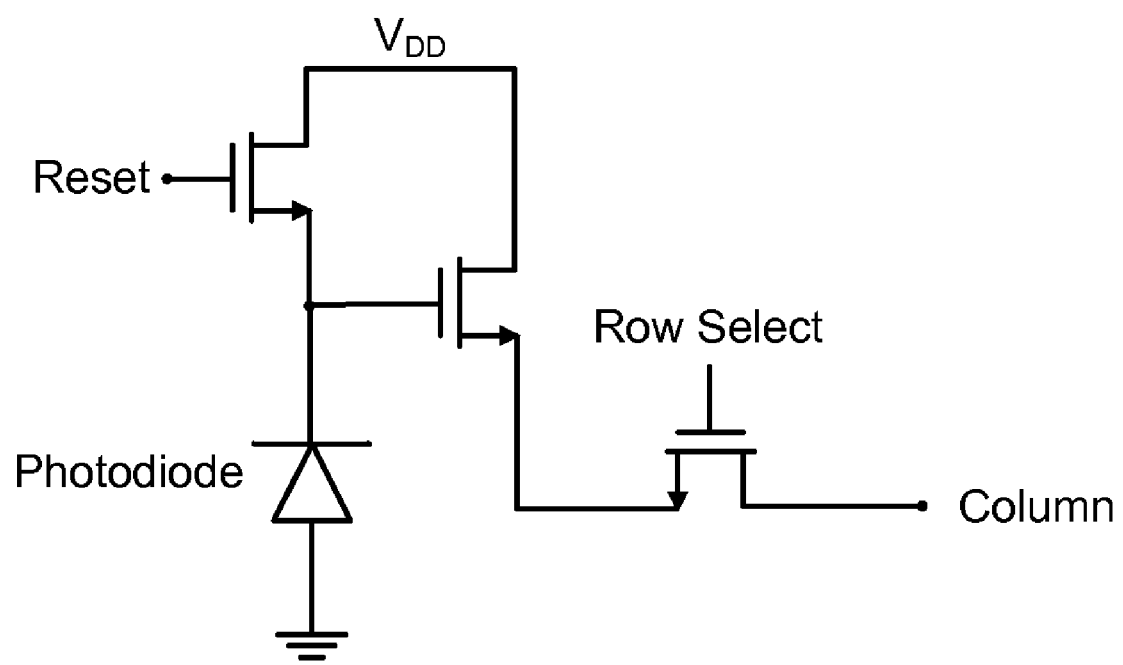
FIG. 4 shows one embodiment of a pixel schematic, which is a typical 3T pixel implementation.
Figure 5:
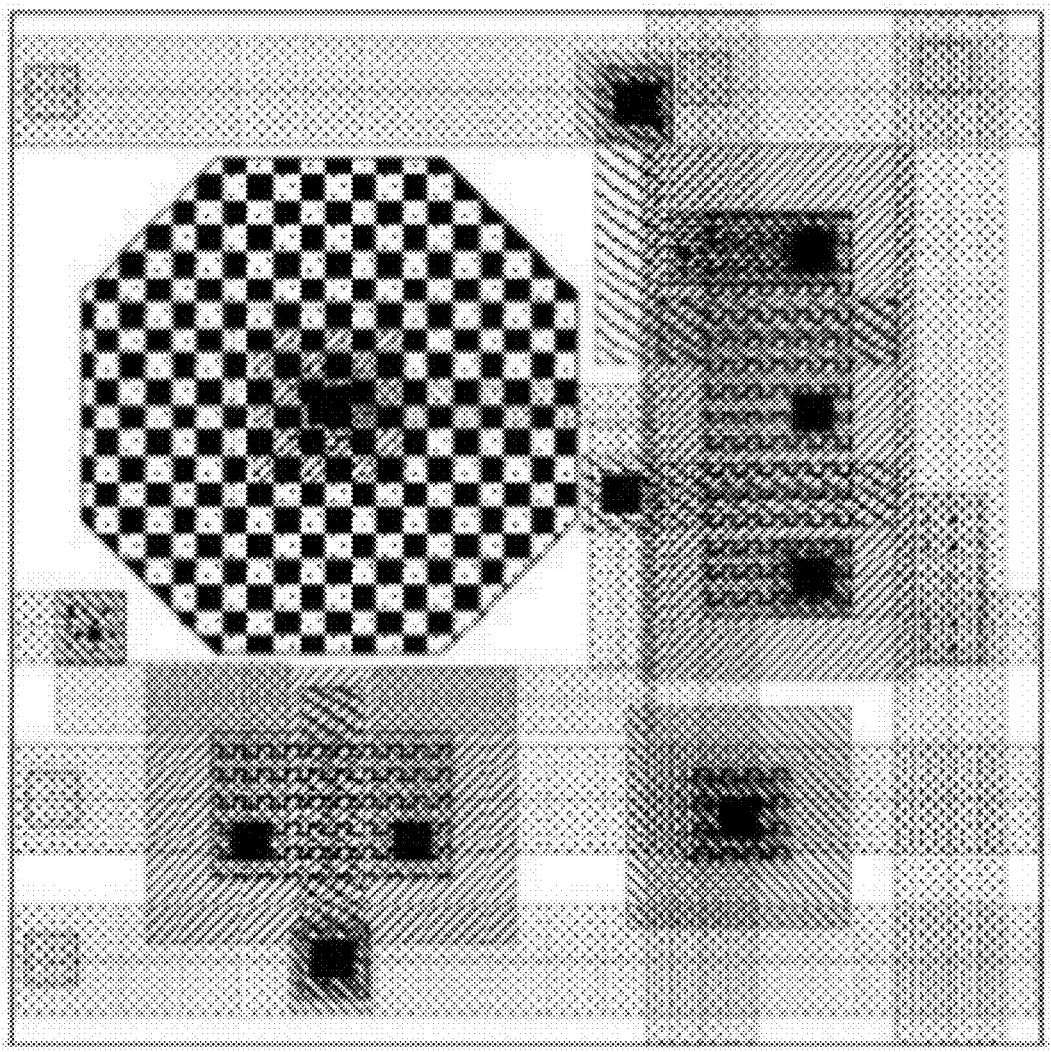
FIG. 5 shows one embodiment of a pixel layout.

In one embodiment, the APS array 12 forms a photosensitive component of the watermarking system 10 in FIG. 3. Referring to FIG. 4, in one embodiment, a pixel sensor 400 can include a three-transistor circuit incorporating an n-well photodiode. The pixel sensor 400 can be included in the APS array 12 in FIG. 3. In some implementations, an APS array including a plurality of interconnected pixel sensors (e.g. pixel sensor 400) can be fabricated on a substrate. The photo-generation of carriers deep in the substrate can lead to pixel "crosstalk" if the carriers diffuse to a neighboring pixel. This can result in charge carriers from on pixel sensor migrating to another pixel sensor. In some implementations, pixel "crosstalk" can be minimized using symmetry in the fabrication of each pixel sensor in the APS array. For example, referring to FIG. 5, in one embodiment, the n-well diode used in a layout of a pixel sensor in an APS array can be octagonal and the surrounding transistors can be arranged in an 'L' shape to give the photodiode approximately the same substrate perspective from each direction.

In one embodiment, 3.3V transistors are used in the pixel sensor to allow for greater sensor dynamic range. The pixel pitch may be 5.62 μm×5.62 μm and the fill factor may be 20%. Random access pixel control may be enabled using row and column decoders. The pixel configurations of FIGS. 4 and 5, and described herein, are illustrative only, and not limiting.

In some embodiments, an 8-bit single slope analog-to-digital converted may be provided for each column of pixels in an APS array. In a digitization cycle, a small differential circuit, using a comparator, can compare a pixel signal from a column bus to a ramp signal. A digital count can continue throughout the digitization cycle, and when the ramp signal is greater than the pixel signal, the comparator output can trigger a bank of flip-flops to latch a digital value for that column. The digital value can be stored in the flip-flops until the column is selected by decoding logic. Once selected, tri-state buffers can feed the digital value to an output bus.

In a preferred embodiment, the digital components included in the watermarking system 10 of FIG. 3 can operate at 1.8V. Operation at the voltage level can reduce the power consumption of the system 10. This can be beneficial where the power provided to the system 10 is limited, e.g., battery power.

A random number generator (RNG) can be used to produce a stream of pseudorandom bits. A Random number generator can be implemented as, for example, a linear-feedback shift register (LFSR), a feedback with carries shift register (FCSR) or a filtered feedback with carries shift register (F-FCSR). In one embodiment, the watermark is a stream of pseudorandom bits, such as a stream generated by a linear-feedback shift register. An LFSR can operate by performing an operation such as an exclusive-OR (XOR) on bit values from certain register positions. In one embodiment, the result can be fed back into the beginning of the LFSR. As a result, the values streaming out of the last register position of the LFSR may appear to be random but can be deterministic based on the initial state of the LFSR.

The value of the initial state of the LFSR can be used as a key to reproduce a watermark for detection later. In some embodiments, the key can be unique to the APS array and can remain private, to minimize the possibility of false verification. In some implementations, the user may set the bit length of the key.

In one embodiment, the LFSR can provide a stream of bits dependent on the key. The key can be provided by, or dependent on, the APS array, which can also be referred to as an imager, itself. In some implementations, pixels in an APS array can differ slightly from one another. This can cause fixed pattern noise (FPN) in the image data captured by the APS array. The noise in the image data can be referred to as fixed because it will not change over time. Additionally, each APS array can have a unique FPN, which can serve as an identifying property to the APS array. The FPN in the APS array can be quantified as an analog signal level. In order to use the FPN as an identifying property of the APS array, the analog signal level can be represented as a digital value. For example, an analog-to-digital converter can be used to convert the analog signal value to a digital value that can be associated with the individual APS array. Once represented in a digital form, the FPN can be used as a digital key (e.g., a fixed, secret sequence of bits) that can be associated with the individual APS array.

For example, the digital key can also be a derivation of the FPN (fixed pattern noise) of the APS array. Such a derivation of the FPN of the APS array can be, for example, the values of all pixels included in the imager that correspond to a certain illumination (e.g., uniform field) value. In another example, the derivation of the FPN of the array can be a combination of pixel values, such as an average over a plurality of blocks of pixels, an average of part of the pixel blocks, pixel rows or pixel columns, depending on the length (e.g., size in bits) of the key. In some implementations, the FPN of the APS array can be eliminated. Therefore, it may not be used to determine a key.

There may be multiple ways to derive a key for the LFSR. In one embodiment, bit values from the ADC can be fed into the LFSR, generating an initial state. These values can also serve as the watermark key. In some cases, performing an extended dark field exposure on a specific row of the APS array can result in acceptable pixel sensor values. A similar procedure with a uniform light field can allow elements of the fixed pattern noise to be extracted for use as a key. Alternatively, either of these operations can be combined with random pixel access to allow the key to be obtained from points spread across the array.

In order to mitigate the potential problem of the watermark obscuring the image, the watermark bits can be preferentially added to the lesser bits produced by the ADC. In a preferred embodiment, 2-bits, and more preferably 4-bits, can be added to each sensor pixel value of the ADC digitized output image data from the APS array. The bit-stream produced by the LFSR can be grouped into 4-bit vectors and added to the 8-bit ADC output. Precautions can be taken to ensure the addition operation does not overflow the dynamic range. For example, each watermarked pixel value can be an 8-bit value. When the watermark bits are added to the 8-bit digitized sensor pixel values, an overflow may occur. In some implementations, if an overflow occurs, the original digitized pixel value may be restored. In other implementations, the watermarked pixel may be truncated at its maximum value.

Figure 7:
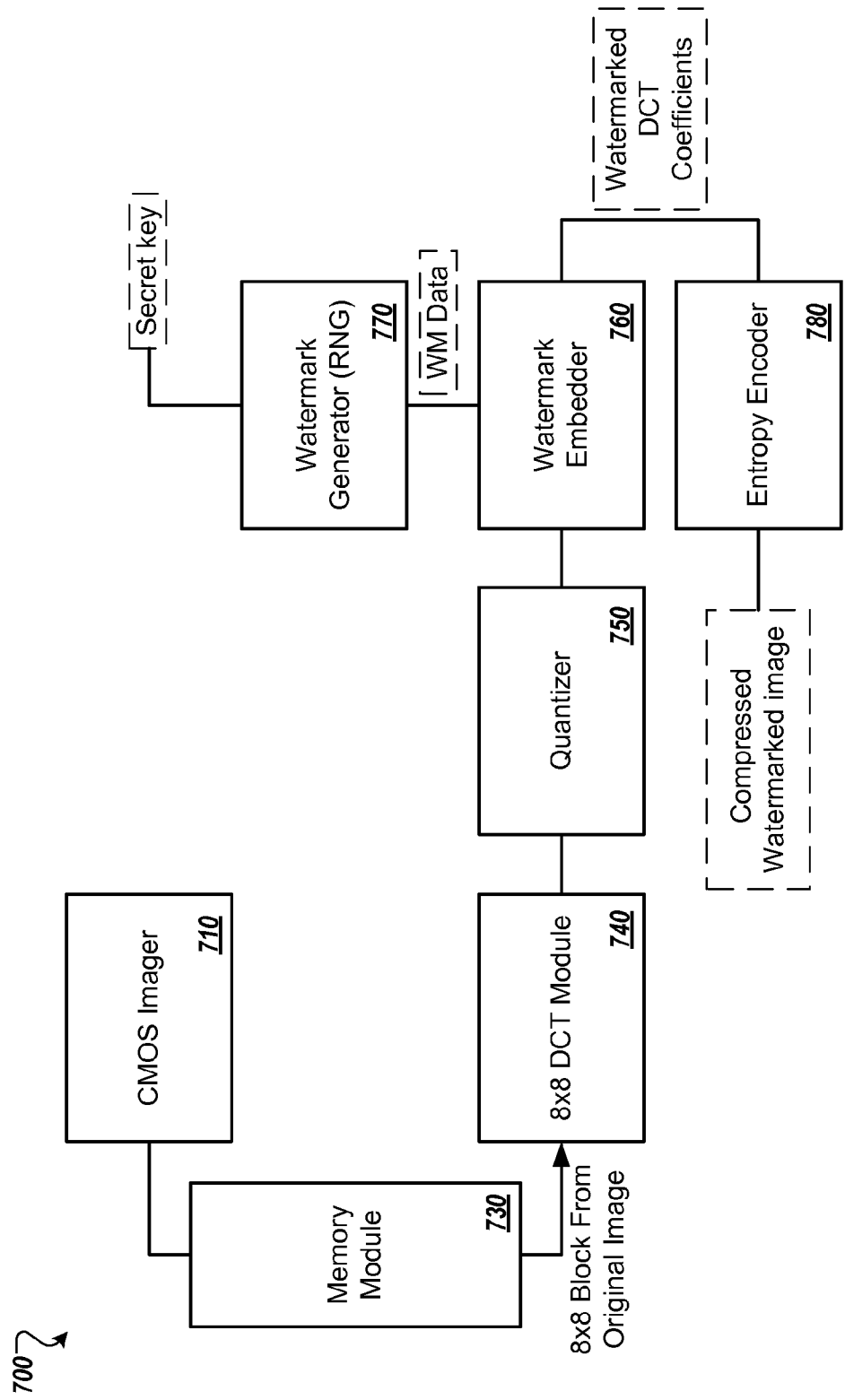
FIG. 7 is a block diagram of an exemplary watermarking system, according to one embodiment.

Referring now to FIG. 7, in some embodiments a watermark (WM) can be embedded into an image in the frequency domain. In some embodiments, a discrete cosine transform (DCT) and quantization can be performed on a digital image where a watermark can be subsequently embedded in the quantized image data. In some embodiments, the embedding of a watermark in an image in the frequency domain may have certain advantages as compared to the embedding of a watermark in an image in the spatial domain. For example, the watermark embedder can ensure that a watermark is not embedded in a high frequency component of the DCT that may subsequently be discarded in the event of a JPEG (Joint Photographic Experts Group) lossy compression. In addition, in some cases, the watermark can be more easily embedded into an image as it can be included as part of a JPEG encoder.

Still referring to FIG. 7, in one embodiment, a watermarking system 700 includes a CMOS imager 710, a memory module 730, a DCT module 740, a quantizer 750, a watermark generator (Random Number Generator (RNG)) 770, a watermark embedder 760, and an entropy encoder 780. A clock (not shown) can control the sequencing of operations performed in the watermarking system 700.

An exemplary data flow in the system 700 begins with the CMOS imager 710, which can include a sensor array and an analog-to-digital (A/D) converter (not shown) that outputs digitized image data of an original captured image. The output image can be a sequence of digitized values of raw pixel data from all of the pixels included in the CMOS imager 710 sensor array. The pixels in the CMOS imager 710 can be organized, for example, in a matrix of M rows by N columns. Various techniques known in the art can be carried out to convert the analog readout of the CMOS imager 710 to a digital signal, depending upon the specific architecture of the sensor array. For example, an output sequence from the CMOS imager 710 can issue a single pixel (usually 8-10 bits) for each clock cycle in the watermarking system 700 in a raster scan fashion.

The digital image data can be stored in the memory module 730. This can allow the CMOS imager 710 to capture a subsequent image while the stored image is processed. Storing the digital image data in memory can allow the system 700 to watermark and compress the image a block at a time. Since the watermark is embedded in the DCT domain, the digital image data undergoes an 8×8 block discrete cosine transform and quantization. The digital image data can be divided into 8×8 blocks for performing the discrete cosine transform. An 8×8 block of the digital image data from the original image can be input to the DCT module 740. In general, it may be preferable that at least eight rows of the digital image data be stored in a buffer included in module 740 before the image data is processed by the DCT module 740. After a latency period, the DCT blocks in the DCT module 740 can issue one DCT coefficient for every clock cycle in the watermarking system 700.

The issued DCT coefficient can be input to the quantizer 750. The quantizer 750 can quantize the coefficient according to, for example, JPEG quantization tables known in the art. The discrete cosine transform can be two-dimensional and, in such cases, the coefficients can represent spatial frequencies in two directions, as shown in FIG. 8A. Referring to FIG. 8B, to reduce one dimension, the coefficients from each block can be organized in a "zigzag" order, such that, in general, higher absolute value spatial frequencies are followed by the lower absolute spatial frequencies.

Referring back to FIG. 7, the watermark generator 770 can be a pseudo-random number generator, which can generate the WM data using a random number generator (RNG). In some embodiments, the random number generator can use an initial "secret" key to generate a random number. Knowledge of the secret key and the architecture of the RNG may therefore be necessary in some circumstances to reconstruct the WM data. The watermark embedder 760 can use the secret key and the architecture of the RNG to mark the DCT coefficients, using, e.g., an algorithm described below. The entropy encoder 780 can encode the resulting watermarked DCT coefficients of the image data. The output of the entropy encoder 780 can be a compressed watermarked image (e.g., a JPEG encoded image). In some implementations, the entropy encoder 780 can use run-length encoding to encode the resulting watermarked DCT coefficients of the image data. In some implementations, the entropy encoder 780 can be implemented as a Huffman encoder.

In some implementations, the system 700 can be included in a digital video camera. The resulting compressed watermarked image can be an MPEG (Motion Picture Experts Group) encoded image. The image can be encoded in one of a plurality of MPEG auxiliary encoding standards that can include but are not limited to MPEG-2 and MPEG-4. In some implementations, the system 700 can be included in a portable wireless communication device capable of capturing images. The resulting compressed watermarked image can be an ITU (International Telecommunication Union) compressed image. The image can be encoded in one of a plurality of ITU auxiliary encoding standards that can include but are not limited to H.261, H.262, H.263 and H.264.

In general, according to one embodiment of an algorithm for creating a watermark, the watermark embedder 760 modifies a number of cells, N, in the DCT data of every block. These cells may include non-zero values and may be found in the mid-frequency range. Generally, modifying any of these cells may not result in a significant visual change to the image (e.g., to the naked eye), yet the modification can be well accommodated in the DCT data even after quantization.

Figure 9A:
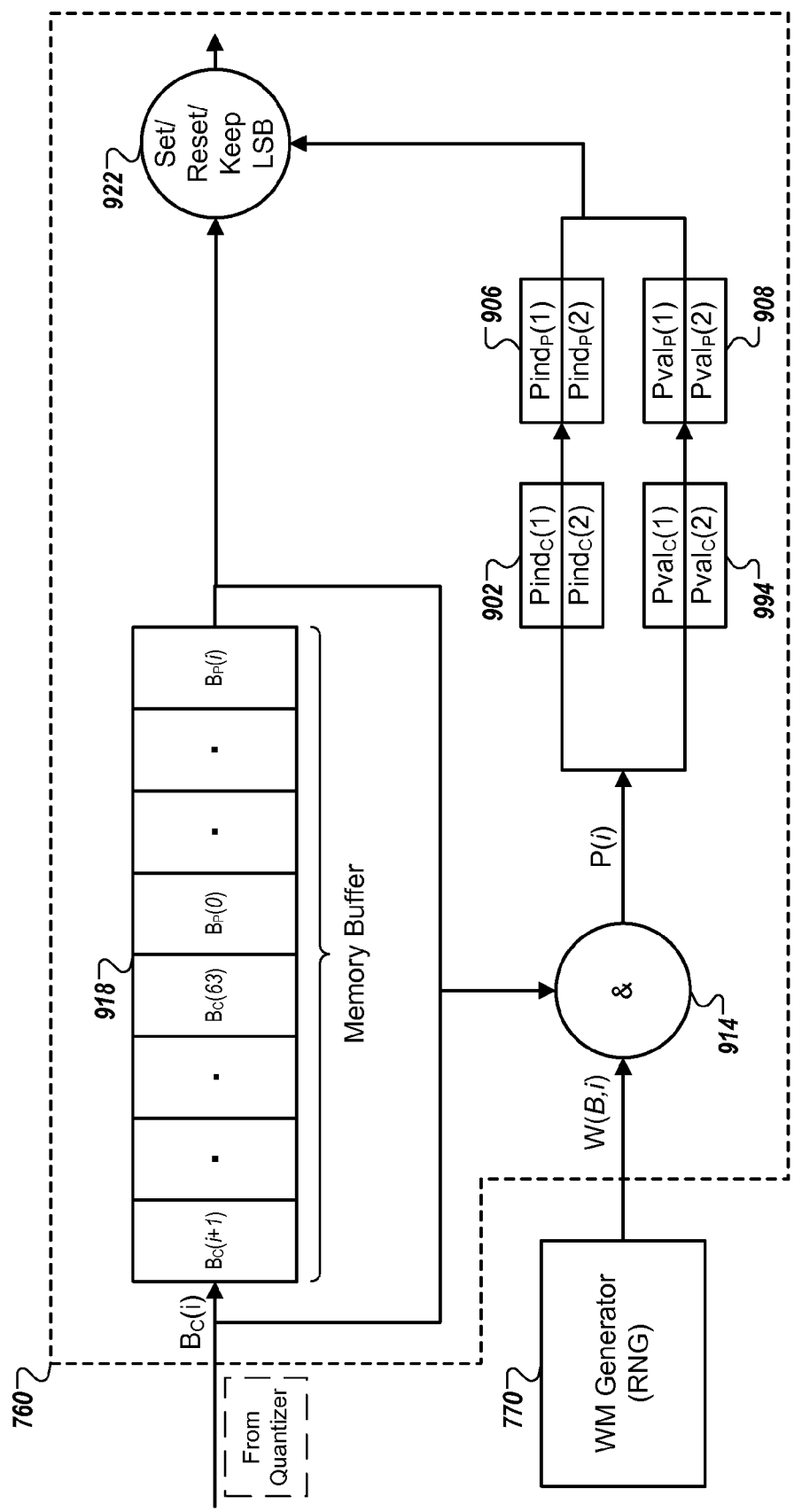
FIG. 9A is a block diagram of an exemplary watermark embedder, according to one embodiment.

Referring now to FIG. 9A, in one embodiment, the watermark embedder 760 can work in two phases: a first calculation phase and a second embedding phase. During the calculation phase, the DCT data is received by the watermark embedder 760, the DCT data is used for calculations, and the resulting DCT data is stored in a memory buffer 918 included in the watermark embedder 760.

The DCT data stored in the memory buffer 918 can be used in the embedding phase. $B_C(i)$ represents the DCT data that has been received from the quantizer 750, where i represents the position of the DCT coefficient according to the zigzag order shown in FIGS. 8A and 8B. In a similar manner, $B_P(i)$ represents the DCT data that is read out of the memory buffer 918. $B_C(i)$ and $B_P(i)$ can be the DCT data values of two adjacent blocks in corresponding positions denoted by i. The watermark bit, $W(B_C,i)$, corresponds to the DCT data in the block, $B_C$, in position, i. A binary value, P(i), can be calculated by a combination unit module 914 such that $P(i)=W(B_C,i)*B_C(i)*B_P(i)$.

A register 902, $Pind_C$, is used to store the largest values of the position, i, for which P(i) is non-zero. Thus, the block, $B_C$, can receive a number, N, of mid-frequency position cells. The DCT data in the block, $B_C$, can be verified to be non-zero. It can also be determined that the verified non-zero cells are the cells to be modified. As described above, the watermark embedder 760 can modify the number of cells, N, identified in the DCT data of the block. Referring to FIG. 9, N=2 is considered. The values of P(i) in the lower positions of the registers can be used to determine how to modify the identified cells, according to:

$$Pval_C(l) = XOR\ (P(i)),\ \ i \prec Pind_C(N)$$
$$i = l, l+N, L+2N, \ldots$$

where l is a number between 1 and N, and N is the number of cells to be modified. A register, $Pind_C(N)$, holds the lowest value of position, i, that is stored in the register $Pind_C$. A register 904, $Pval_C$, can store the modification values generated by the equation.

At the end of the first calculation phase, all of the DCT data is received and stored in the memory buffer 918. The data stored in the registers $Pind_C$ and $Pval_C$ can be considered complete and are then copied to registers 906 and 908, $Pind_P$ and $Pval_P$, respectively.

In the second embedding phase, the DCT data stored in the memory buffer 918 during the first calculation phase can be read out. If the position of the DCT data, $B_P(i)$, (i.e., the value of position, i), is equal to one of the values that is stored in register $Pind_P$, then the DCT data, $B_P(i)$, can be modified. For example, if $Pind_P(0)=30$, and $Pval_P(0)=1$ then the least significant bit (LSB) of $B_P(30)$ can be set equal to 1 in the set/rest/keep LSB module 922 before the DCT data is sent out of the watermark embedder 760.

Figure 9B:
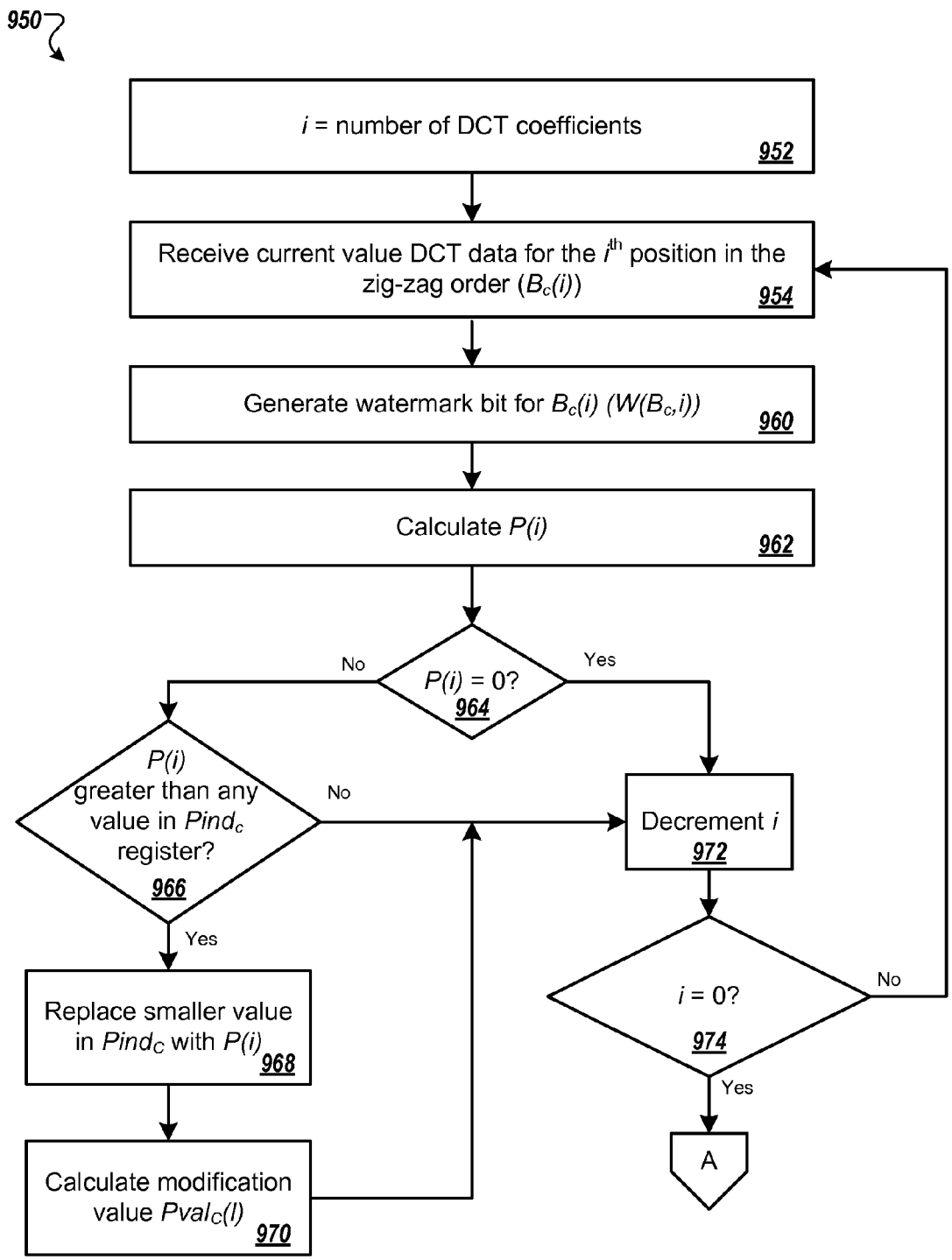
FIGS. 9B and 9C are flow charts of exemplary methods for watermarking a block of image data, according to one embodiment.
Figure 9C:
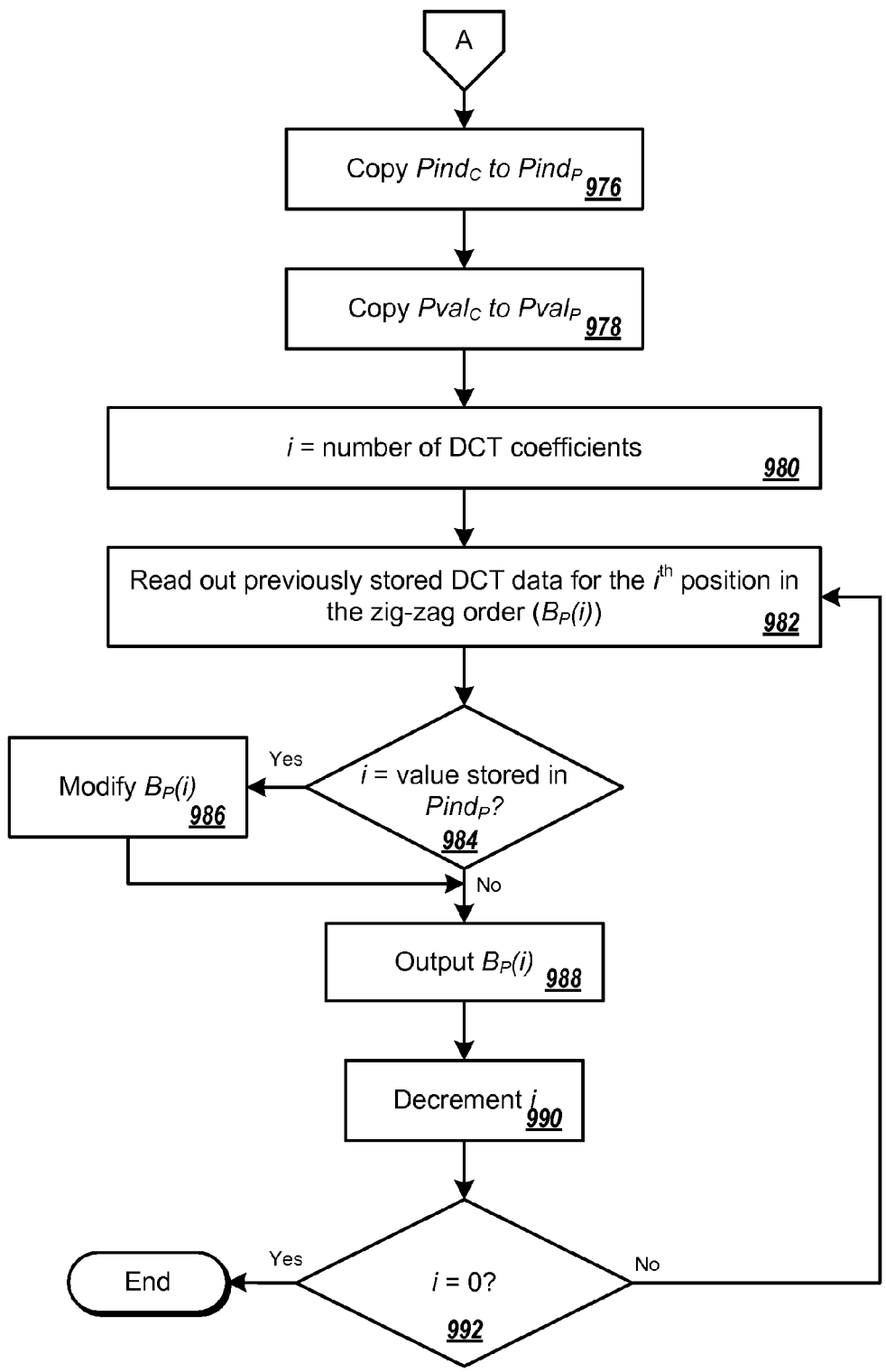

Referring now to FIGS. 9B and 9C, one method 950 for embedding a watermark into a block of image data can include steps 952 to 992. The steps of the method can follow the order as shown, although in some cases, some or all of the steps may be executed in a different order.

An index, i, into the DCT coefficients of a block of image data organized in a zig-zag order is set equal to the total number of DCT coefficients (step 952). A memory buffer (e.g., memory buffer 918 in FIG. 9A) can receive and store the current DCT coefficient for the ith position in the image data zig-zag order ($B_C(i)$) (step 954). A watermark generator (e.g., watermark generator 770 in FIG. 9A) can generate a watermark bit for the corresponding to the DCT data in the block, Bc, in the ith position ($W(B_C,i)$) (step 960). A binary value, P(i), can be calculated by a such that $P(i)=W(B_C,i)*B_C(i)*B_P(i)$ (step 962). If P(i) is not equal to zero (step 964), P(i) is compared to the values in the a first register $Pind_C$, (e.g., register 902 in FIG. 9A), and if P(i) is greater than any of the values in the register $Pind_C$ (step 966) then P(i) can replace the smallest value in register $Pind_C$ (step 968). A modified value of $Pval_C(l)$ is calculated (according to the equation described with reference to FIG. 9) and stored in a second register $Pval_C$ (e.g., register 904 in FIG. 9A) (step 970). The method 950 continues to step 972.

If P(i) is equal to zero (step 964), the method 950 also continues to step 972 where i is decremented. If i is not equal to zero (step 974), the method 950 continues to step 954 to receive and store the next DCT coefficient. If i is equal to zero (step 974), the method 950 continues to step 976 where the register $Pind_C$ is copied into a third register $Pind_P$ (e.g., register 906 in FIG. 9A). Next, the register $Pval_C$ is copied into a fourth register $Pval_P$ (e.g., register 908 in FIG. 9A) (step 978). The value, i, is set equal to the number of DCT coefficients (step 980). The previously stored DCT coefficient for the ith position in the image data zig-zag order ($B_P(i)$) can be read out (step 982). If i is equal to the value stored in $Pind_P$ (step 984), $B_P(i)$ is modified based on the bit value in $Pval_P(i)$ (step 986). The method 950 continues to step 988. If i is not equal to the value stored in $Pind_P$ (step 984), the method also continues to step 988 where the value $B_P(i)$ is output from the embedder (step 988). The value, i, is decremented (step 990). If i is not equal to zero (step 992), the method 950 continues to step 982 to read out the next DCT coefficient. If i is equal to zero (step 992), the method 950 ends.

Figure 10:
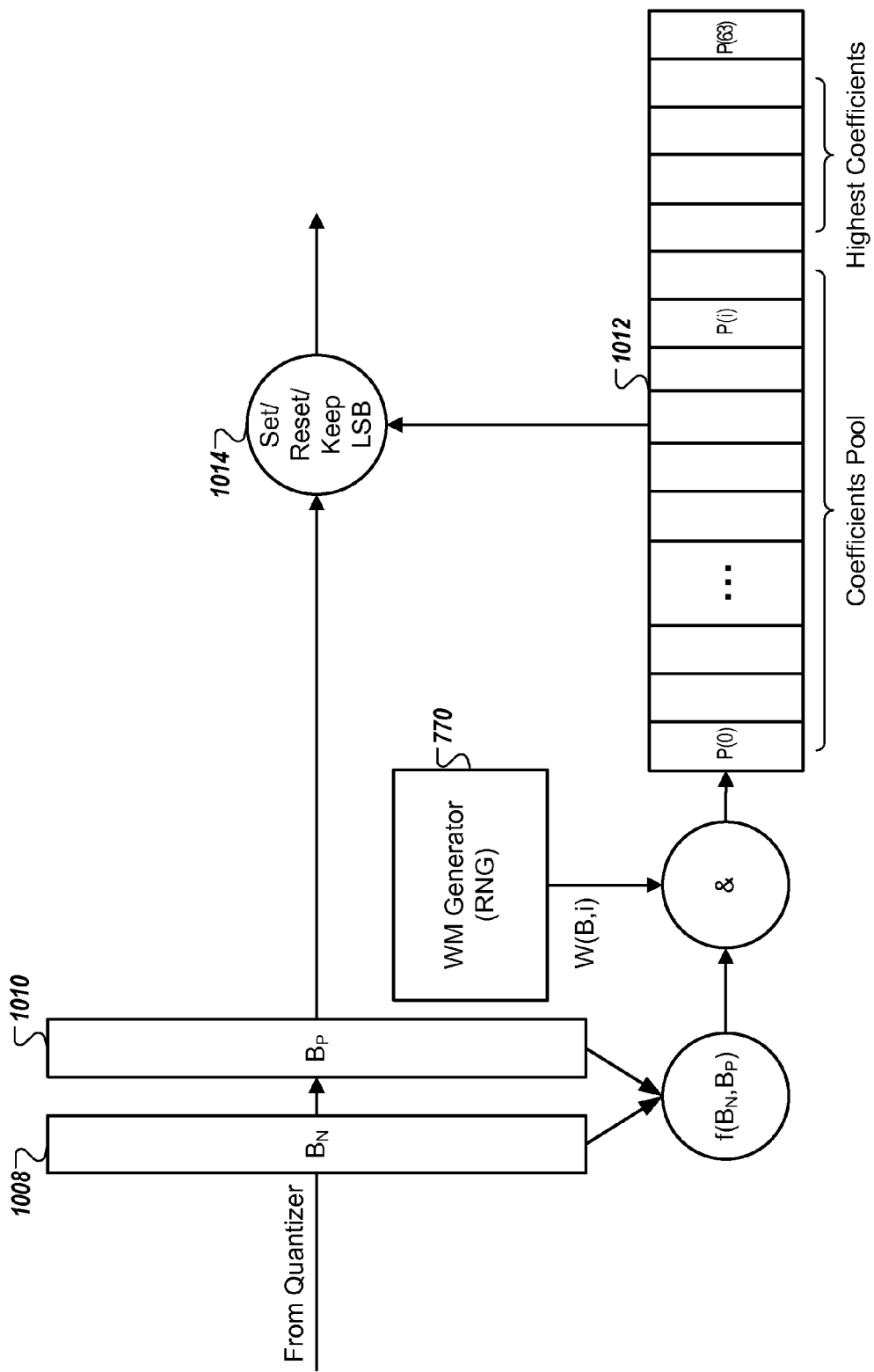
FIG. 10 is a block diagram of an exemplary watermark implementation, according to one embodiment.

Referring now to FIG. 10, in some implementations, a first algorithm can perform watermark embedding in an image where the embedding can be performed one block (e.g., 8 rows×8 columns) at a time. In certain implementations, each block can undergo a discrete cosine transformation and quantization after which the resulting 64 coefficients can be stored in a neighbor stack 1008($B_N$). The previous content of the neighbor stack 1010, $B_N$, can be shifted into a processed stack 1010 (Bp). A temporary binary stack 1012 (P) can then be created. The function $f(B_N,B_P)=(B_N(i)\neq 0)\ \&\ (B_P(i)\neq 0)$ can be used to determine the values in the temporary binary stack 1012 (P). Therefore the cell, P(i), will equal 1 when $B_N(i)$, $B_P(i)$ and the corresponding output value from the watermark generator 770, W(B,i), are all non-zero.

In some embodiments, a set/reset/keep LSB module 1014 can use the processed stack 1012 to embed the watermark in the DCT data. The highest non-zero bits in the binary stack 1012 can point to the coefficients in the processed stack 1010 ($B_P$) where the watermark is to be embedded. These bits can be referred to as pointer bits. The remainder of the bits in the binary stack 1012 can be divided into n segments. In some implementations, some segments may be larger than other segments in order to match the size of the binary stack 1012. Each segment can correspond to one of the coefficients in the processed stack 1010 ($B_P$) marked by the pointer bits. The bits from each segment are exclusive-OR'ed (XOR'ed) and the result, a single bit, can determine the LSB of the corresponding coefficient in the processed stack 1010 ($B_P$.)

In some implementations, a second algorithm can perform watermark embedding in an image where a more aggressive quantization can be used. The function, $f(B_N,B_P)$, is not a binary function but a function that can produce several bits. In this embodiment, if, after quantization, few non-zero coefficients remain, the watermark can still be distinguishable due to the larger variation. Referring to FIG. 10, the second algorithm can follow a similar manner as the first algorithm.

In certain implementations, each block can undergo a discrete cosine transformation and quantization after which the resulting 64 coefficients can be stored in a neighbor stack 1008 ($B_N$). The previous content of the neighbor stack 1008 ($B_N$) can be shifted to a processed stack 1010 (Bp). A temporary binary stack 1012 (P) can be created that includes multiple bits per stack entry.

The function, $f(B_N, B_P)$, can be implemented such that $P(i)=(B_P(i)*B_N(i))$ & $WM(B,i)$. Therefore, a bit in the cell, $P(i)$, will equal 1 when the corresponding bit in $B_N(i)$, $B_P(i)$ and the corresponding output value from the watermark generator 770, $W(B,i)$, are all non-zero.

In some embodiments, a set/reset/keep LSB module 1014 can use the processed stack 1012 to embed the watermark in the DCT data. The highest non-zero bits in the binary stack 1012 can point to the coefficients in the processed stack 1010 ($B_P$) where the watermark is to be embedded. These bits can be referred to as pointer bits. The remainder of the bits in the binary stack 1012 can be divided into n segments. In some implementations, some segments may be larger than other segments in order to match the size of the binary stack 1012. Each segment can correspond to one of the coefficients in the processed stack 1010 ($B_P$) marked by the pointer bits. Before the elements in each segment can be exclusive-OR'ed (XOR'ed), a binary pool is created by comparing two adjacent elements in a segment such that $P_s(i)$ is equal to 1 if $P(i-1)<P(i)$ otherwise $P_s(i)$ is equal to 0. The elements in each segment can then be exclusive-OR'ed (XOR'ed), and the result, a single bit, can determine the LSB of the corresponding coefficient in the processed stack 1010 ($B_P$.)

Without wishing to be bound by theory, it is contemplated that as the number of cells, N, modified by a watermark increases, the robustness of the algorithms likewise increases, while at the same time image quality can be reduced. In some embodiments, for the number of cells, N, as low as 2, performance is satisfactory. In some implementations, a block that produces less than N non-zero cells, $P(i)$, can be considered unmarked and disregarded. In some embodiments, blocks that are distinctively homogeneous and have low values for high frequency coefficients can be problematic. This is because a watermark embedded in a homogeneous block may result in a perceptible change to the image, e.g., to the eye of the perceiver.

Detection may be performed in a similar manner. In one embodiment, the input is the watermarked image in a JPEG format. The detector first decodes the entropy encoded data. The process then follows the steps of the embedding process, except that instead of determining the value of the LSB of each coefficient, a comparison can be made to verify that the LSB of each coefficient can be equal to the calculated value. The software and/or hardware platform used can provide additional processing advantages for detection. In particular, it is reasonable to assume that an attacker would attempt to cover full surfaces rather than isolated spots, and so morphological closing on the output detection image can improve detection ratios.

Figure 11:
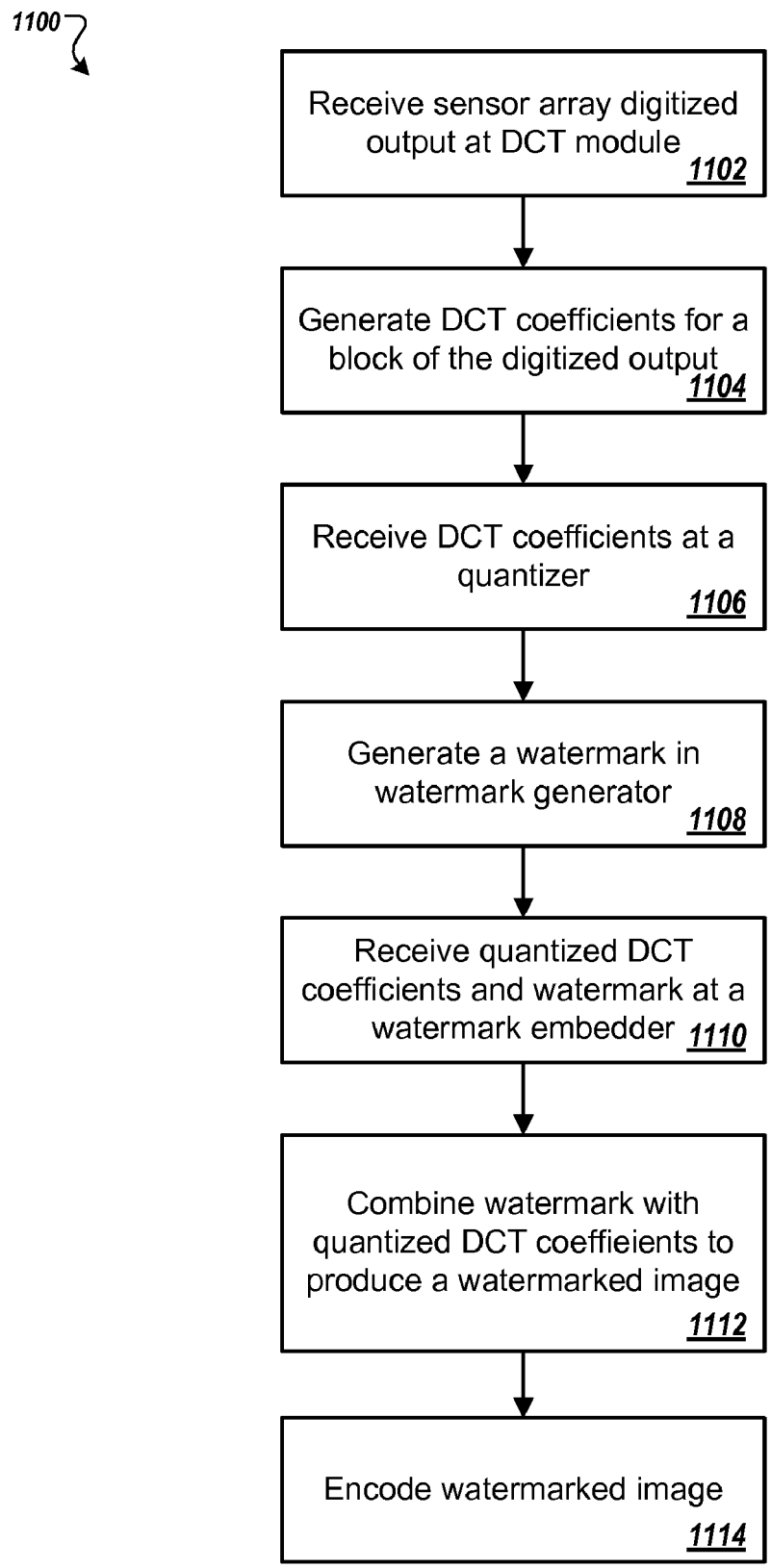
FIG. 11 is a flow chart of an exemplary method for watermarking an image, according to one embodiment.

Referring now to FIG. 11, one method 1100 for embedding a watermark into an image can include steps 1102-1114. The steps of the method 1100 can follow the order as shown, although in some cases, some or all of the steps may be executed in a different order.

A DCT module can receive a block of image data that is digitized and output from a sensor array (step 1102). The memory module (e.g., memory module 730 in FIG. 7) can receive digitized sensor data from a CMOS imager (e.g., CMOS imager 710 in FIG. 7). The memory module 730 can provide a digitized 8×8 block of image data to the DCT module 730. The DCT module can generate the DCT coefficients for the received block of digitized sensor data (step 1104). A quantizer (e.g. quantizer 750 in FIG. 7) can receive the DCT coefficients (step 1106). A watermark generator (e.g., watermark generator 770 in FIG. 7) can generate a watermark (step 1108). A watermark embedder (e.g., watermark embedder 760 in FIG. 7) can receive the quantized DCT coefficients and the watermark (step 1110). The watermark embedder can combine the watermark with the quantized DCT coefficients to produce a watermarked image (1112). An encoder (e.g., entropy encoder 780) can encode the watermarked image (step 1114) and generate a compressed, watermarked image.

In some implementations, the method 1100 can be performed in a single integrated circuit. For example, referring to FIG. 7, the integrated circuit may include the DCT module 740, the quantizer 750, the watermark generator 770, the watermark embedder 760 and the entropy encoder 780. In some implementations, the method 1100 can be performed in multiple integrated circuits. For example, again referring to FIG. 7, a first integrated circuit may include the DCT module 740, and the quantizer 750. A second integrated circuit may include the watermark generator 770, the watermark embedder 760 and the entropy encoder 780.

In some implementations, the method 1100 can be performed using a combination of integrated circuits and software, where a controller (e.g., a microprocessor or a microcontroller) can execute the software and also control the integrated circuits. For example, referring to FIG. 7, a first integrated circuit may include the DCT module 740, and the quantizer 750. A second integrated circuit may include the watermark embedder 760 and the entropy encoder 780. The controller, using a software algorithm, may generate a watermark and provide it to the second integrated circuit. In another example, referring to FIG. 7, an integrated circuit may include the DCT module 740, the quantizer 750, the watermark embedder 760 and the entropy encoder 780. The controller, using a software algorithm, may generate a watermark and provide it to the integrated circuit. In preferred implementations, a single integrated circuit (e.g., a microcontroller or a field programmable gate array (FPGA) can include many of the modules shown in FIG. 7 (e.g., DCT module 740, quantizer 750, watermark embedder 760 and the entropy encoder 780).

Watermarking circuits and systems of the type disclosed herein, as well as variants thereof, can be integrated into imaging systems such as cameras, video recorders, scanners, and other imaging systems. In some implementations, the imaging system can be configured to generate and embed a watermark, similar to the method outlined in FIG. 11. For example, a digital camera can include circuitry and associated imaging hardware configured in such a way as to perform the method 1100. The watermarking circuit and system used to perform the method 1100 may be any of the type disclosed herein, as well as variants thereof. In some cases, the methods described herein can generate a compressed, watermarked image in a secure digital camera (SDC). In some implementations, the secure digital camera can store the compressed, watermarked image locally. In some implementations, the compressed, watermarked image can be transmitted either by direct connection or wirelessly to a computer. In some implementations, the compressed, watermarked image can be transmitted either by direct connection or wirelessly to a printer. In some implementations, the digital camera functionality can be included in a mobile device, such as a cellular phone, personal data assistant (PDA), or other similar types of mobile devices.

In another example, an electronic scanner can perform the method 1100. The watermarking circuit and system used to perform the method 1100 may be any of the type disclosed herein, as well as variants thereof. The methods described herein can be used to add a watermark to a scanned image to produce a watermarked image The scanned, watermarked image can be subsequently compressed. In some implementations, the electronic scanner can transfer the compressed, watermarked image either by direct connection or wirelessly to a computer. In some implementations, the compressed, watermarked image can be transmitted either by direct connection or wirelessly to a printer.

In an additional example, a digital video camera can perform the method 1100. The watermarking circuit and system used to perform the method 1100 may be any of the type disclosed herein, as well as variants thereof. In some implementations, the method 1100 can watermark each video frame in a video stream. In some implementations, the method can be used to watermark select (e.g., every other frame, every third frame, etc.), or random frames of the video stream. In some implementations, the determination of which video frames and how many video frames in a video stream are watermarked can vary dependent upon the video compression standard implemented in a video camera. For example, any DCT based video compression standard can perform the method 1100 to watermark video frames in a video stream. For example, a watermark can be embedded in each "I" frame of each group of pictures (GOP). In some cases, a watermark can be embedded into every five to 10 video frames dependent on the size of the GOP.

Figure 12:
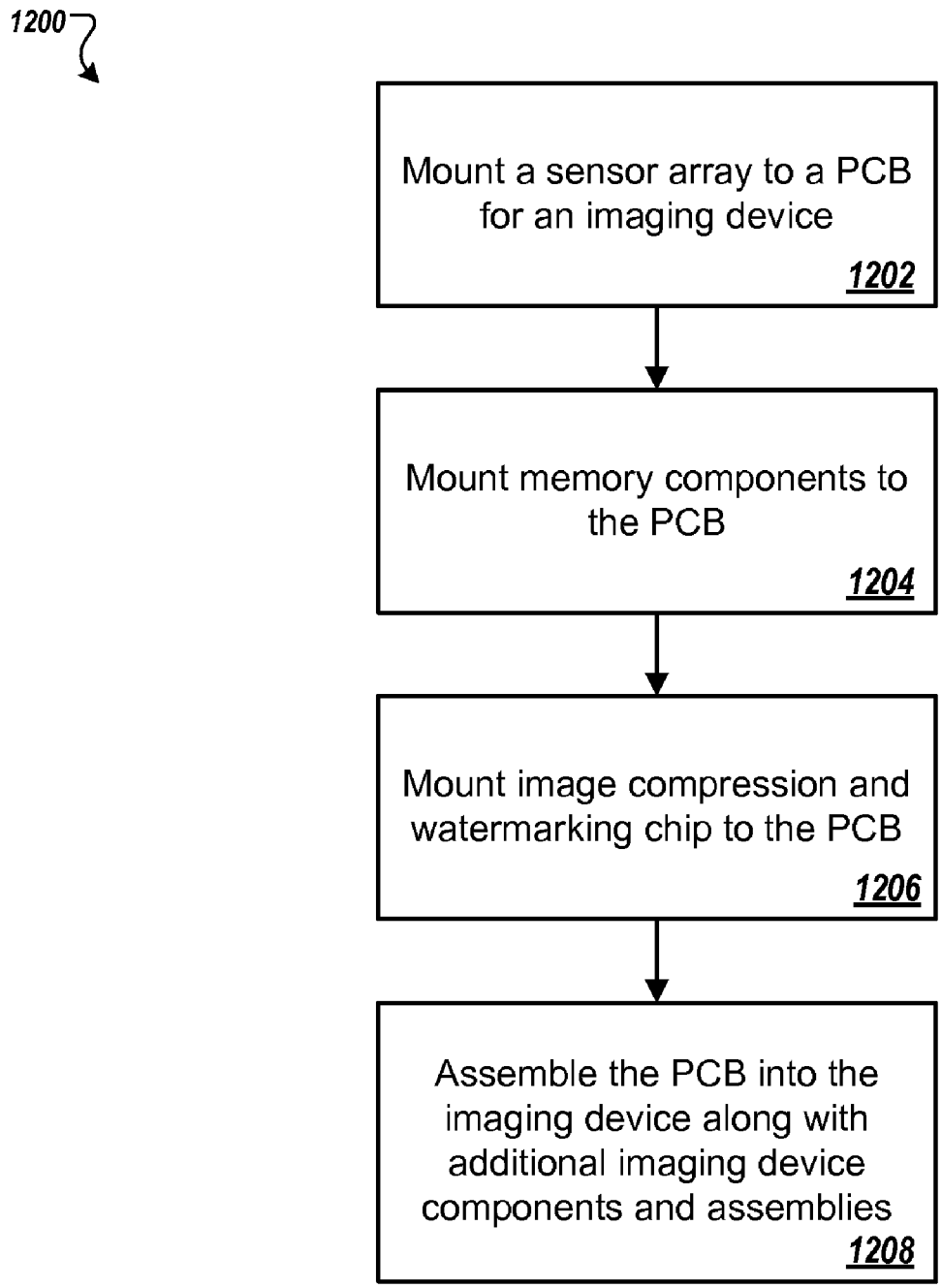
FIG. 12 is a flow chart of an exemplary method for the assembly of an imaging device that includes watermarking, according to one embodiment.

Referring now to FIG. 12, one method 1200 for the assembly of an imaging device that includes watermarking can include steps 1202-1208. The steps of the method 1200 can follow the order as shown, although in some cases, some or all of the steps may be executed in a different order.

For example, the method 1200 can be part of an assembly process for an imaging device in a manufacturing facility. An imager (e.g., CMOS imager 710 in FIG. 7) can be mounted to a printed circuit board (PCB) for use in an imaging device (1202). Memory components (e.g., memory module 730 in FIG. 7) can be mounted to the PCB (step 1204). The watermarking and image compression integrated circuit (chip) can be mounted to the PCB (step 1206). Referring to FIG. 7, for example, the DCT module 740, the quantizer 750, the watermark generator 770, the watermark embedder 760 and the entropy encoder 780 can be included in a watermarking and image compression integrated circuit. The PCB can be assembled into the imaging device along with any additional imaging device components (step 1218). For example, the PCB can be assembled into a digital camera along with the lens, motors, buttons, switches, knobs, and other controls. Also included in the digital camera assembly can be a viewfinder, a liquid crystal display (LCD) for image preview and camera control, and an overall camera enclosure.

Figure 13:
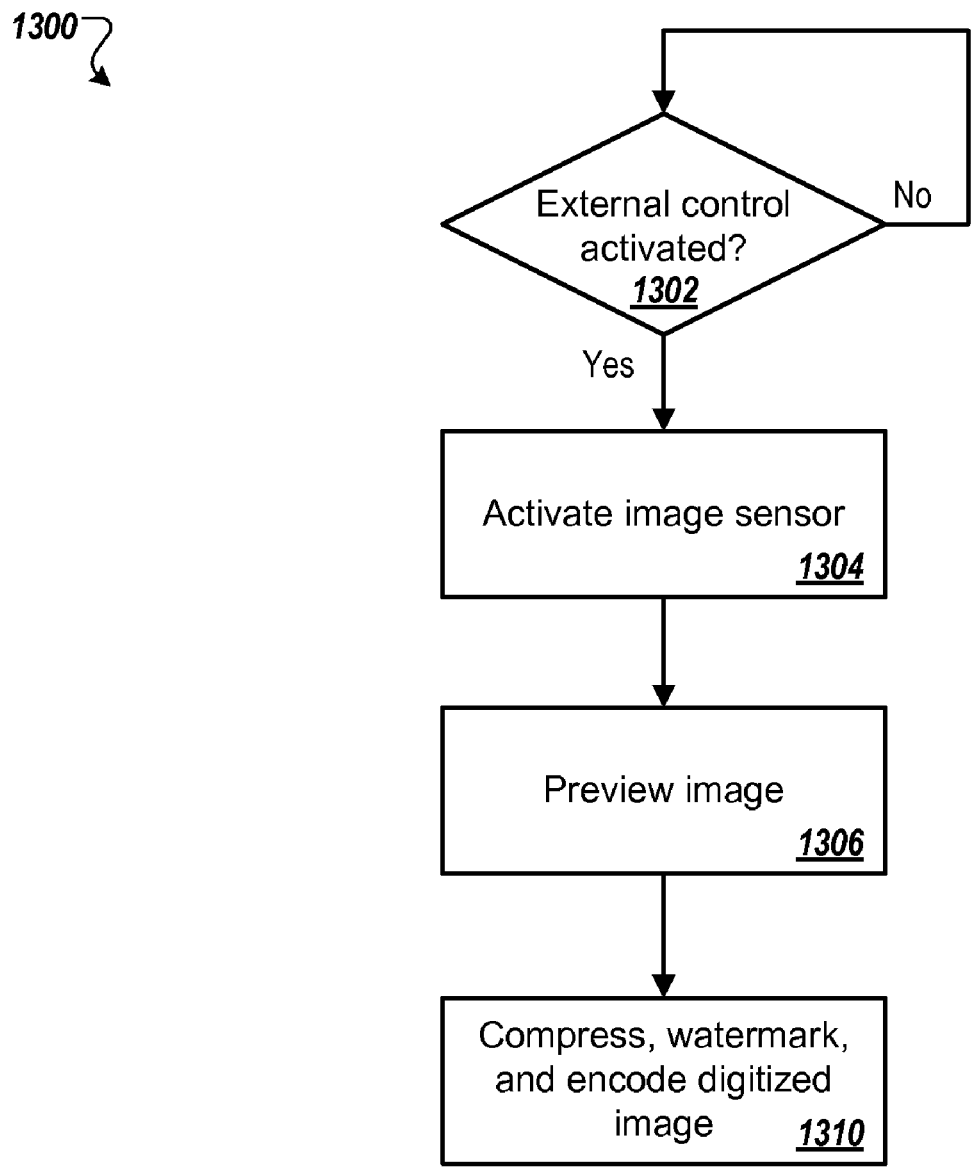
FIG. 13 is a flow chart of an exemplary method for using an imaging device that includes watermarking, according to one embodiment.

Referring now to FIG. 13, one method 1300 for using an imaging device that includes watermarking can include steps 1302-1312. The steps of the method 1300 can follow the order as shown, although in some cases, some or all of the steps may be executed in a different order.

The method 1300 can begin when a user activates an external control mechanism (step 1302) (e.g., presses a button on a digital camera). Once the user activates the external control mechanism, the method 1300 can activate an image sensor (step 1302). For example, when the image sensor is included in a digital camera, a user can aim the camera at a scene of interest and press a button that allows the image sensor to integrate the image light, forming a captured image of the scene of interest framed by the camera lens. In another example, when the image sensor is included in a digital scanner, the user can press a button to activate the scanning process. The scanner can scan a given image and an image sensor can integrate the reflected light from the scanned image forming a captured image.

A user can preview the scanned image (step 1304). For example, when the image sensor is included in a digital camera, the user may be able to view the captured image on a display (e.g., an LCD) included in the digital camera. In another example, when the image sensor is included in a digital scanner, the digital scanner may be connected (e.g. via a wired or wireless connection) to a computer, or portable computing device (e.g., a personal digital assistant (PDA)), where a user can view a preview of the captured, scanned image. The method 1300 continues and the captured image can be transformed, quantized, watermarked and encoded (step 1308).

EXAMPLES

The following examples merely illustrate certain aspects of the described watermarking systems and methods, and in no way limit the disclosure or the claims.

Watermarking System

A watermarking system, including a DCT module (e.g., DCT module 740 in FIG. 7), a quantizer (e.g., quantizer 750 in FIG. 7) and a watermark embedder (e.g., watermark embedder 760) was implemented in Verilog. The system 700 was simulated by constructing a watermark algorithm written in Matlab. Watermark data were embedded in two sample images. The images were modified after the watermark had been inserted and then a software detector was used to identify the modifications and localize them. The functionality of the high-density logic (HDL) implementation was tested by embedding the watermark in a number of blocks and detecting it using the software detector.

Referring now to FIGS. 14 and 15, the algorithm was tested on two images: the "Baboon" image (FIG. 14A-D), which has significant high frequency patterns and the "Lena" image (FIG. 15A-D), which has several homogeneous (low spatial frequency) areas. The watermark embedding and detecting processes and results were based on the number of watermarked modified cells, N, being equal to 2. FIGS. 14 and 15 include the original image (FIG. 14A and FIG. 15A), images after the watermark was embedded (FIG. 14B and FIG. 15B), and a tampered version of the watermarked images (FIG. 14C and FIG. 15C). The tampering was done using a "cover-up" attack, in which the attacker covers parts of the image using blocks from other parts of the image. If the watermarked data were the same for all blocks, the detector may not be able to distinguish the covered areas from the authentic areas.

Figure 14A:
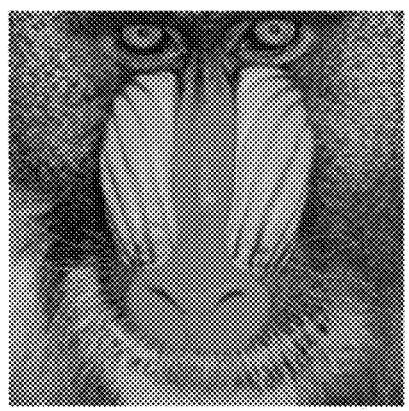
FIGS. 14A-D are digital photos of an original image with high frequency patterns, the image after embedding a watermark, a tampered version of the watermarked image, and a map of the tampered blocks from a detector output, respectively.
Figure 14B:
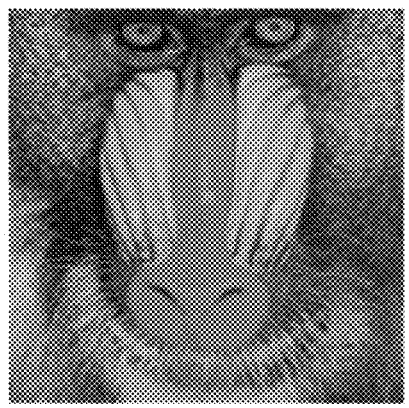
Figure 14C:
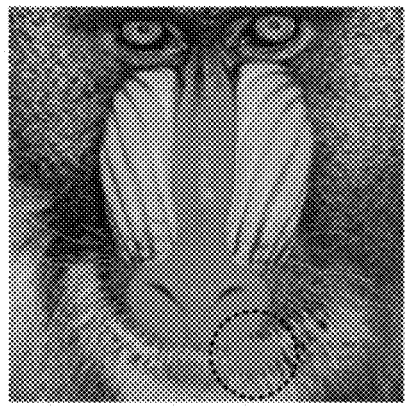
Figure 14D:
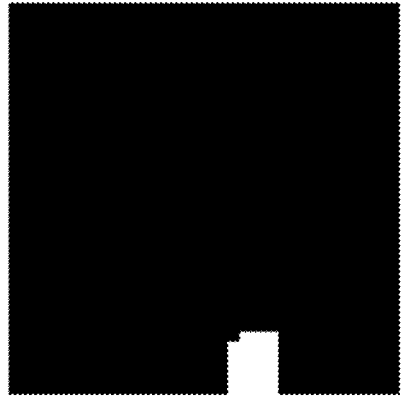
Figure 15A:
FIGS. 15A-D are digital photos of an original image with low spatial frequency areas, the image after embedding a watermark, a tampered version of the watermarked image, and a map of the tampered blocks from a detector output, respectively.
Figure 15B:
Figure 15C:
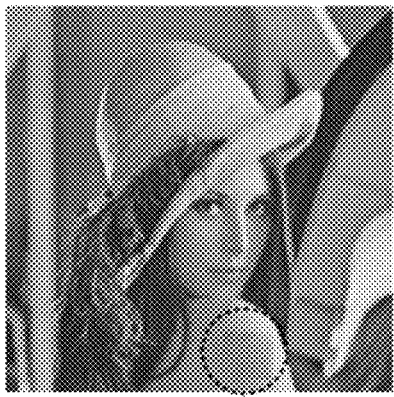
Figure 15D:
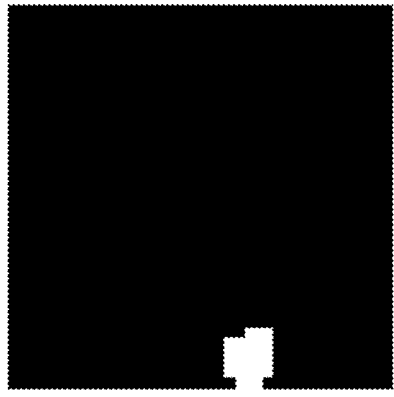

In this example, the described watermarking algorithms can generate unique watermarked data for each block and create a dependency between adjacent blocks to detect such attacks. The detector, to determine the authenticity of the image, can process the tampered image. Referring again to FIG. 14 and FIG. 15, in one implementation, the detector output can be a map of the blocks identified as tampered, as shown in FIG. 14D for the "Baboon" image and FIG. 15D for the "Lena" image. Although more than 99% of the DCT data cells match the original pattern, the detector clearly identified the location where tampering had occurred within the images.

Referring now to FIG. 16, in some embodiments there may be a tradeoff between image quality and a detection ratio. A table 1600 shows data for two levels of quantization with a varying number, N, of coefficients used for watermarking. The level of the quantization can be expressed by the percentage of the non-zero coefficients after quantization. Peak signal to noise ratio (PSNR) values are calculated to estimate image degradation after the image was compressed and the watermark had been added. The PSNR values are calculated using the equation: PSNR=20 log(b/rms), where b is the largest possible value. The detection ratio can be defined as the number of detected blocks divided by the number of non-authentic blocks in the tampered image.

Referring again to FIGS. 14 and 15, in some implementations, in order to make a meaningful change to the image, several blocks may be altered. The effective detection ratio in such cases can be much higher. For example, if only three blocks were altered, the chance that none of the blocks (or their neighbors) would be detected is only 0.5% (in a worst case scenario).

In some embodiments, image degradation may occur due to the quantization. Referring again to FIG. 16, PSNR differences as a function of the number of coefficients watermarked, N, are 0.5-1.5 dB. In some implementations, the likelihood of tampering detection is better where the number of coefficients watermarked, N, is larger (e.g., N=4), especially when the quantization level is higher. Alternatively, a larger value for N may require a slight increase in hardware.

CMOS Imaging Chip

Figure 6:
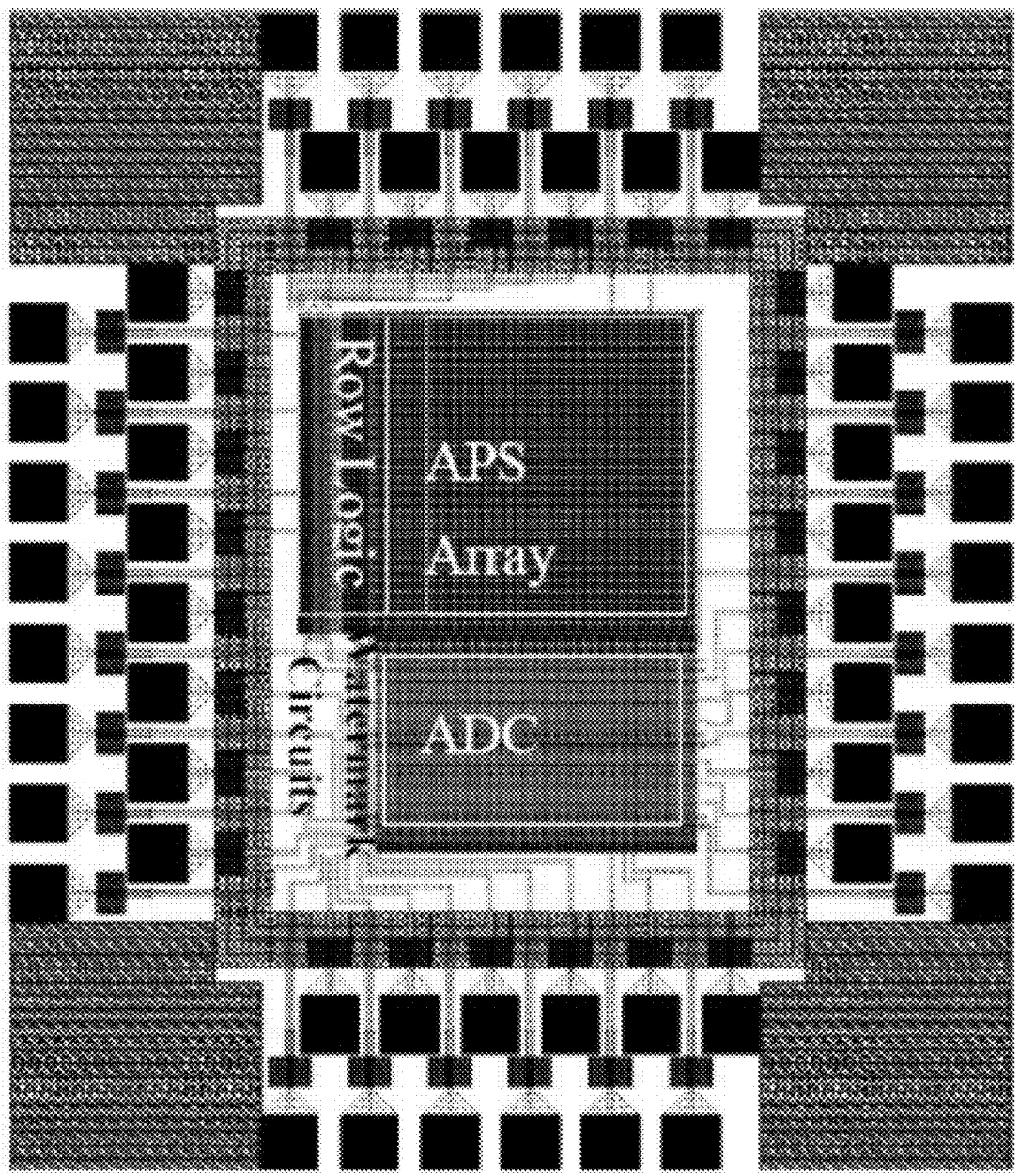
FIG. 6 shows one embodiment of a chip layout.

An imaging chip was created by incorporating a 64×64 CMOS APS array in a 0.18u CMOS process. The layout was accomplished using the Cadence Design System Environment (Cadence Corporation, San Jose, Calif.) and a final chip design is shown in FIG. 6. Simulations were conducted using Spectre. The device was fabricated in the TSMC 0.18u1.8V/3.3V process through the Canadian Microelectronics Corporation (Kingston, Ontario, Canada). The final chip size (including pads) was 1122 μm×1302 μm.

A watermarking algorithm according to the present disclosure was tested with Matlab (The MathWorks, Natick, Mass.). The results are shown in FIGS. 1 and 2. A 4-bit strength was chosen because it offered greater probability of successful detection while sacrificing a minimal loss in clarity.

Linear correlation with the watermark at a later time can give an indication of the presence or absence of the watermark. FIG. 2 shows the distribution of correlation coefficients for 100 watermarked test images. In both 2-bit and 4-bit cases, there is a clear separation between groups with a watermark and those without. The addition of 4-bit values gives a wider separation and hence easier, more reliable selection of a present/absent threshold on the correlation coefficient.

Figure 17:
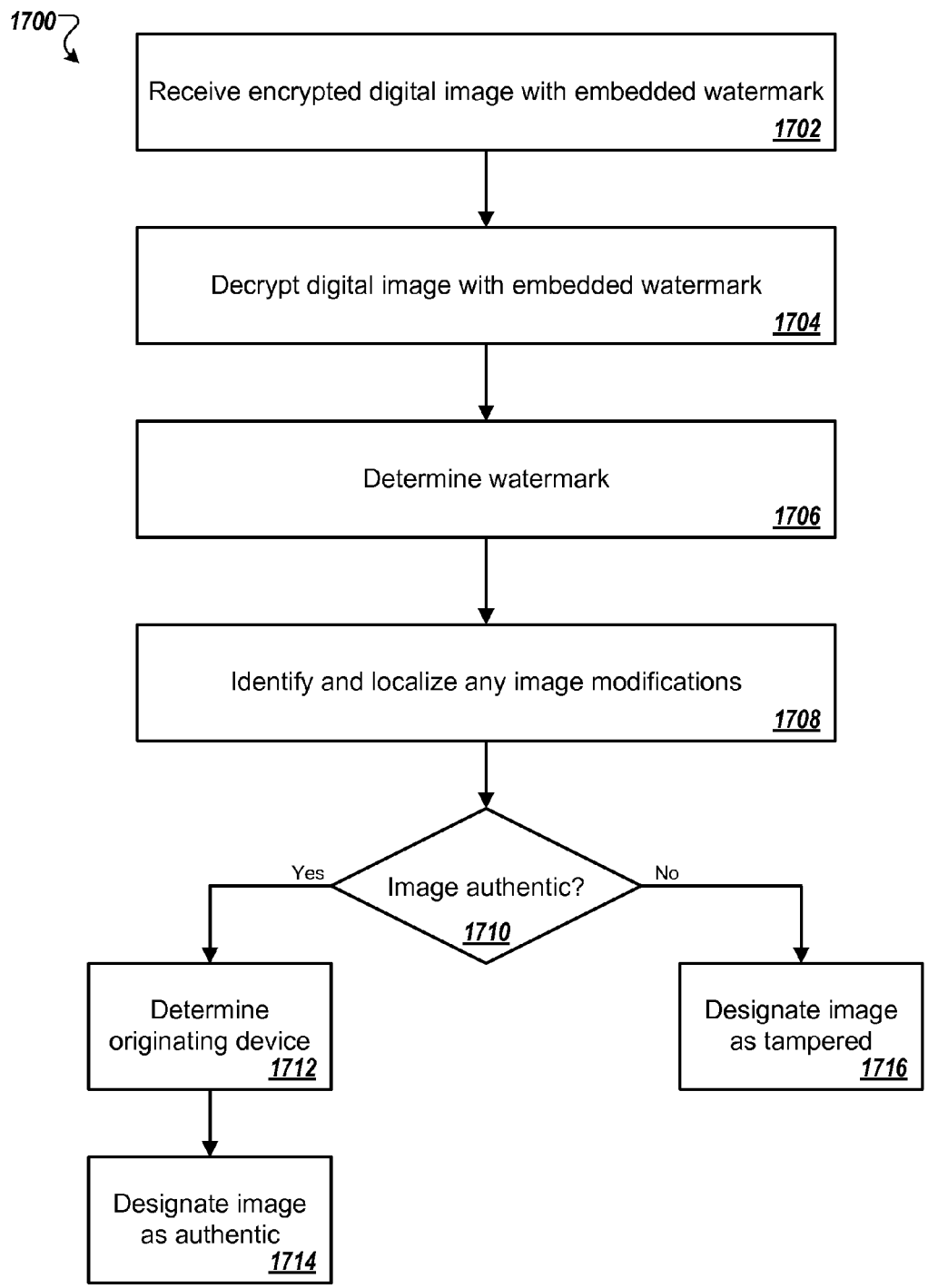
FIG. 17 is a flow chart of an exemplary method for authenticating an origin of a digital image.

Referring now to FIG. 17, one method for authenticating an origin of a digital image can include steps 1702-1714 as shown in the flowchart 1700. The steps can follow the order as shown, although in some cases, some or all of the steps may be executed in a different order.

Beginning at step 1702, a computing device can receive an encrypted digital image with embedded digital watermark data provided by an imaging system. For example, the encrypted, watermarked digital image can be produced by the watermarking system 700 described with respect to FIG. 7.

Next, at step 1704, the computing device can decrypt the encrypted image. In some implementations, the encrypted, watermarked image received by the computing device can be in JPEG format. In some implementations, the computing system can decode the entropy encoded data in the JPEG formatted image (e.g., decompress the image) prior to decryption.

Next, at step 1706, the decrypted image is analyzed to detect the watermark and any additional image modifications. In some implementations, the computing system can include a watermark detector that can analyze the digital image data to determine the location and characteristics of the watermark. The watermark detector can also determine if the digital image data has been modified, which can indicate tampering.

At step 1708, the detector can identify and localize any detected modifications to the original image. For example, modifications can be the result of the addition of the watermark itself as well as unwanted image tampering.

Next, at step 1710, a verification process verifies that the LSB of each DCT coefficient of the image is equal to a calculated value, thus authenticating the image. For example, referring back to FIG. 7, the calculated value can include a random number generated by the watermark generator 770 using a key. As previously described, the key can be determined from characteristics associated with the sensor array included in the CMOS imager 710 (FIG. 7).

If it is determined that the image is authentic (step 1710), unique characteristics of the particular sensor array that captured the original image can be determined from one or more unique aspects of the key. This can allow for the identification of the sensor array that was used to capture the original image. In some imaging implementations, for example, in an array of security cameras, a plurality of imaging devices may be used to capture multiple images and feed those images to central processing station, e.g., a central computing system where they may be analyzed, authenticated or stored. The individual cameras in the array can each include a watermarking system, for example, watermarking system 700 described with respect to FIG. 7. The computing system can then determine, e.g., by the method currently described, from which of the array of imaging devices a particular image originated. This information can be used to confirm the authenticity of the received image as it can be correlated to its origin (step 1712).

The image can be marked as authentic (step 1714) by, for example, setting (e.g., setting equal to "1") an authentication flag in the computing device that can be associated with the image. If it is determined that the image is not authentic (step 1710), the computing device can mark the image as tampered (step 1716) by, for example, resetting (e.g., setting equal to "0") an authentication flag in the computing device that can be associated with the image. An image may be determined to be not authentic by, for example, determining that a watermark does not exist when one is expected to be included in the image, or, in another example, when it is determined that a watermark was generated and embedded in the image without using the key as described herein.

In some implementations, the computing device can perform additional authentication steps. For example, an attacker may attempt to tamper with an image by covering full surfaces within the image rather than isolated spots within the image. Therefore, applying mathematical morphology to the received, encrypted digital image data, which includes the embedded digital watermark, can improve authentication detection ratios.

Figure 18:
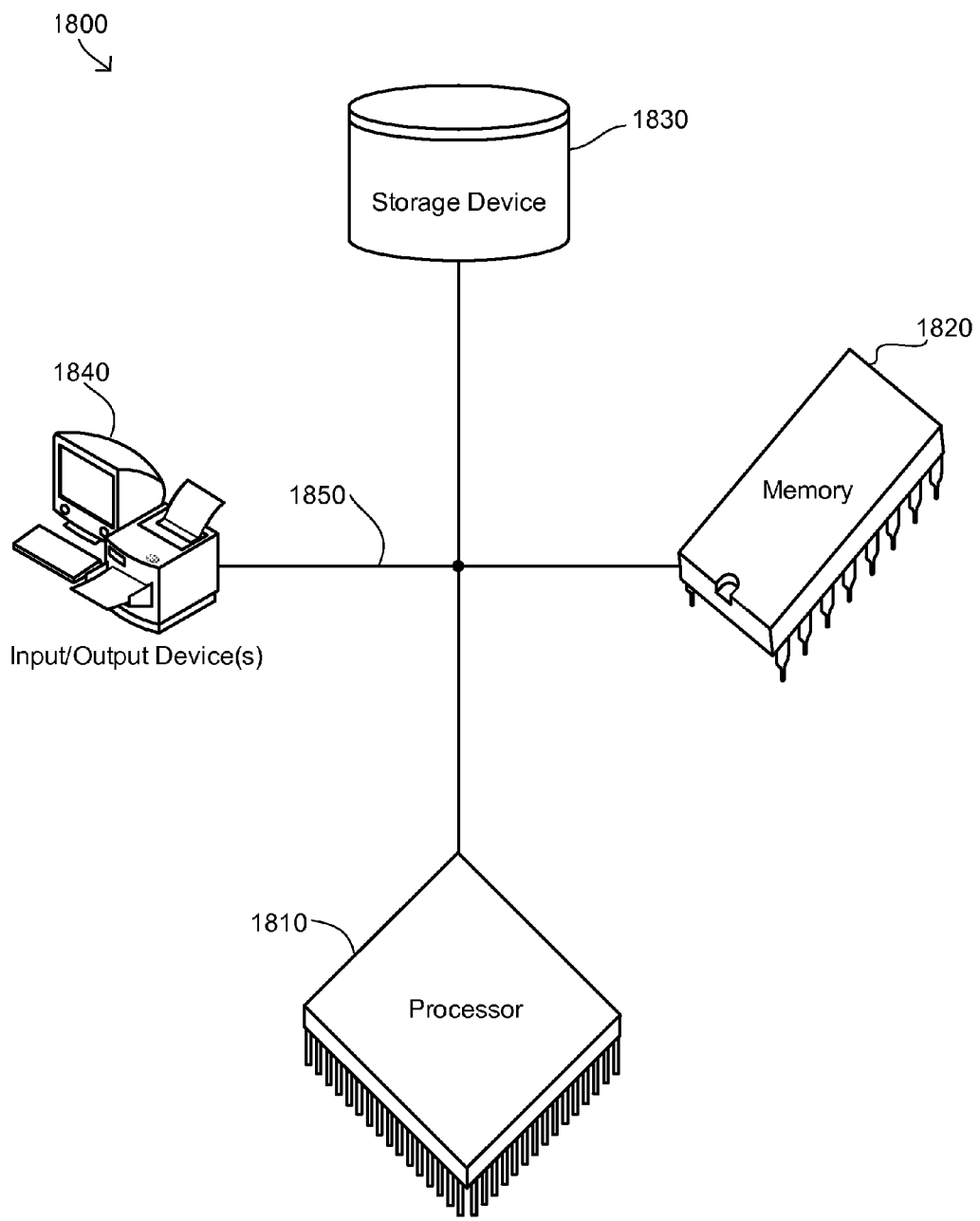
FIG. 18 is a schematic diagram of a generic computer system.

FIG. 18 is a schematic diagram of a generic computer system 1800. The system 1800 can be used in the methods described above, according to one implementation. The system 1800 includes a processor 1810, a memory 1820, a storage device 1830, and an input/output device 1840. Each of the components 1810, 1820, 1830, and 1840 are interconnected using a system bus 1850. The processor 1810 is capable of processing instructions for execution within the system 1800. In one implementation, the processor 1810 is a single-threaded processor. In another implementation, the processor 1810 is a multi-threaded processor. The processor 1810 is capable of processing instructions stored in the memory 1820 or on the storage device 1830 to display graphical information for a user interface on the input/output device 1840.

The memory 1820 stores information within the system 1800. In one implementation, the memory 1820 is a computer-readable medium. In one implementation, the memory 1820 is a volatile memory unit. In another implementation, the memory 1820 is a non-volatile memory unit.

The storage device 1830 is capable of providing mass storage for executable computer code or instructions as necessary to carry out the methods described herein, e.g., the method described with respect to FIG. 17. In one implementation, the storage device 1830 is a computer-readable medium. In various different implementations, the storage device 1830 may be a floppy disk device, a hard disk device, an optical disk device, or a tape device.

The input/output device 1840 provides input/output operations for the system 1800. In one implementation, the input/output device 1840 includes a keyboard and/or pointing device. In another implementation, the input/output device 1840 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device or in a propagated signal, for execution by a programmable processor; and method steps can be performed by a programmable processor executing a program of instructions to perform functions of the described implementations by operating on input data and generating output.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. In some implementations, the display device can be used to indicate to the user that a non-authentic image has been detected.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

A number of embodiments have been described. Nevertheless, it will be understood that various modifications may be made without departing from the spirit and scope of the concepts disclosed herein. For example, in some implementations DCT data values of one or more adjacent blocks in corresponding positions denoted by i can be used to calculate a binary value P(i) where, in calculating P(i), the watermark will also be included in the calculation. Accordingly, other embodiments are within the scope of the following claims.

What is claimed is:

1. An imaging system, comprising:
an active pixel sensor imaging array configured to capture an image, said imaging array being in electronic communication with a digitizer that digitizes an output of the imaging array;
a discrete cosine transform circuit in electronic communication with said imaging array that generates coefficients for a block of said digitized array output;
a quantizer circuit, in electronic communication with said discrete cosine transform circuit, that quantizes said coefficients;
a watermark generating circuit for generating a digital watermark;
a watermark embedder circuit, in electronic communication with said discrete cosine transform circuit and said watermark generating circuit that receives a transformed, quantized block of said digitized array output and said digital watermark and produces a watermarked image therefrom; and
an entropy encoder circuit, in electronic communication with said watermark embedder, that receives and encodes said watermarked image, and produces a watermarked image file.

2. The imaging system of claim 1, wherein said active pixel sensor imaging array is a CMOS active pixel sensor array.

3. The imaging system of claim 1, wherein said encoder circuit is a Huffman encoder circuit.

4. The imaging system of claim 1, wherein said active pixel sensor imaging array comprises an n-well photodiode.

5. The imaging system of claim 4, where said n-well photodiode has an octagonal layout.

6. The imaging system of claim 1, wherein said digitizer comprises column parallel analog digital converters (ADCs), pixel parallel ADCs, or a single ADC for the active pixel sensor (APS) array.

7. The imaging system of claim 6, wherein said digitizer comprises column parallel ADCs.

8. The imaging system of claim 1, wherein said watermark generating circuit is a random number generator and said watermark data comprises a stream of pseudorandom bits.

9. The imaging system of claim 8, wherein said random number generator is selected from the group consisting of: a linear-feedback shift register, a feedback with carries shift register, and a filtered feedback with carries shift register.

10. The imaging system of claim 9, wherein said random number generator is adapted to produce said stream of pseudorandom bits from an initial state, and further comprises means for providing bit values from the ADC to generate the initial state of the random number generator.

11. The imaging system of claim 8, wherein said watermark generating circuit generates a digital watermark dependent on a key.

12. The imaging system of claim 11, wherein the key is a secret key.

13. The imaging system of claim 11, wherein said watermark generating circuit generates a digital watermark dependent on the architecture of said random number generator and said key.

14. The imaging system of claim 1, wherein said coefficients for the block of said digitized array output represent spatial frequencies in two dimensions.

15. The imaging system of claim 14, wherein said quantizer circuit is configured to reduce the spatial frequencies to one dimension.

16. The imaging system of claim 15, wherein said quantizer circuit is configured to organize said one-dimensional spatial frequencies in a "zigzag" order.

17. The imaging system of claim 1, wherein said block of said digitized array output consists of eight rows by eight columns.

18. The imaging system of claim 1, wherein said discrete cosine transform circuit, said quantizer circuit, said watermark generating circuit, said watermark embedder circuit and said entropy encoder comprise a JPEG encoder circuit.

19. The imaging system of claim 1, wherein said imaging system is included in a digital video camera.

20. The imaging system of claim 19, wherein said digital video camera utilizes a DCT based video compression standard.

21. The imaging system of claim 20, wherein said digital watermark is embedded in an "I" frame of a group of pictures.

22. A method for embedding a digital watermark, comprising:
    receiving, at a discrete cosine transform circuit, a digitized output of an active pixel sensor array and generating coefficients for a block of said digitized output;
    receiving said coefficients at a quantizer circuit that generates an output comprising transformed, quantized coefficients;
    generating a watermark from a watermark generating circuit;
    generating a watermarked image from a combination of said watermark and said transformed, quantized coefficients at a watermark embedder circuit; and
    entropy encoding said watermarked image into a digitized file format.

23. The method of claim 22, wherein said entropy encoding said watermarked image comprises encoding using a Huffman encoder.

24. The method of claim 22, wherein said active pixel sensor array is a CMOS active pixel sensor array.

25. The method of claim 22, wherein said file format is selected from the group consisting of: JPEG, MPEG-2, MPEG-4, H.261, H.262, H.263, and H.264.

26. A method for providing an imaging system with built-in watermarking, comprising:
    combining an image watermarking chip with a circuit board that is in electronic communication with an imaging sensor array;
    wherein said image watermarking chip comprises:
        a discrete cosine transform circuit that receives a digitized output of said sensor array and generates coefficients for a block of said digitized array output;
        a quantizer circuit, in electronic communication with said discrete cosine transform circuit, that quantizes said coefficients;
        a watermark generating circuit that generates a digital watermark;
        a watermark embedder circuit that receives said coefficients for a block of said digitized array output and said digital watermark and produces a watermarked image therefrom; and
        an encoder circuit, in electronic communication with said watermark embedder, that receives and encodes said watermarked image; and
    wherein said image watermarking chip, said circuit board, and said imaging sensor array are configured and operable to cooperatively produce a digitally-watermarked image from an original, un-watermarked image captured by said imaging sensor array.

27. The method of claim 26, wherein said encoder circuit comprises a Huffman encoder.

28. The method of claim 26, wherein said imaging system is a digital camera, video recorder, scanner, or other imaging device.

29. The method of claim 26, wherein said circuit board is operable to control imaging aspects of said imaging system.

30. A digital watermarking chip, comprising:
    a discrete cosine transform circuit that receives a digitized array output and generates coefficients for a block of said digitized array output;
    a quantizer circuit, in electronic communication with said discrete cosine transform circuit, that receives said coefficients and generates quantized coefficients therefrom;
    a watermark generating circuit that generates a digital watermark based on a key;
    a watermark embedder circuit that receives said quantized coefficients and said digital watermark and produces a watermarked image therefrom; and
    an entropy encoder circuit that receives said watermarked image and encodes said image thereby producing an image file.

31. The digital watermarking chip of claim 30, wherein said entropy encoder circuit comprises a Huffman encoder.

32. An imaging device comprising the digital watermarking chip of claim 30.

33. The imaging device of claim 32, wherein the imaging device is selected from the group consisting of camera, video recorder, and optical scanner.

34. A method for authenticating an origin of a digital image, comprising:
    receiving, at a computing device, an encrypted digital image with embedded digital watermark data provided by an imaging system according to claim 1; and
    providing an authentication result as a display or a tangible output of said computing device as to whether or not said encrypted digital image originated from said imaging system, by:
        (a) decrypting said encrypted digital image using a decryption algorithm; and (b) determining whether or not said digital watermark data was embedded using said imaging system by deciphering said embedded digital watermark data in cooperation with a secret key used by said imaging system for embedding said digital watermark data;

wherein if said deciphering reveals that said digital watermark data was embedded using said secret key said digital image is authentic, and if said deciphering reveals that said digital watermark data was not embedded using said secret key, said digital image is not authentic.

35. The method of claim 34, wherein said digital image is a compressed digital image, and step (a) further comprises decompressing said image.

36. A watermark embedder circuit, comprising:
a memory buffer configured to receive quantized discrete cosine transform (DCT) image data;
a combination unit module configured to generate a calculated binary value;
wherein said calculated binary value is calculated by combining said quantized DCT image data with a watermark, and wherein said calculated binary value has an associated index corresponding to one or more blocks of said quantized DCT data, and wherein said combination unit module is in electronic communication with a watermark generator and said memory buffer;
a first register configured to store a first index value and a second index value, wherein said first index value is a highest numerical index value corresponding to a non-zero calculated binary value, and said second index value is less than said first index value, wherein said first register is in electronic communication with said combination unit module;
a second register configured to store a first modification value and a second modification value wherein said second register is in electronic communication with said first register and said combination unit module;
a third register configured to receive a copy of said first index value and said second index value; wherein said third register is in electronic communication with said first register;
a fourth register configured to receive a copy of said first modification value and said second modification value; wherein said fourth register is in electronic communication with said second register; and
a least significant bit module configured to modify a bit of said DCT image data.

37. An imaging system comprising the imaging system of claim 1, wherein said watermark embedder circuit comprises:
a memory buffer configured to receive quantized discrete cosine transform (DCT) image data;
a combination unit module configured to generate a calculated binary value;
wherein said calculated binary value is calculated by combining said quantized DCT image data with a watermark, and wherein said calculated binary value has an associated index corresponding to one or more blocks of said quantized DCT data, and wherein said combination unit module is in electronic communication with a watermark generator and said memory buffer;
a first register configured to store a first index value and a second index value, wherein the first index value is the highest numerical index value corresponding to a non-zero calculated binary value, and the second index value is less than the first index value, wherein said first register is in electronic communication with said combination unit module;
a second register configured to store a first modification value and a second modification value wherein said second register is in electronic communication with said first register and said combination unit module;
a third register configured to receive a copy of said first index value and said second index value; wherein said third register is in electronic communication with said first register;
a fourth register configured to receive a copy of said first modification value and said second modification value; wherein said fourth register is in electronic communication with said second register; and
a least significant bit module configured to modify a bit of said DCT image data.

38. A method for embedding a watermark in a second block of image data, comprising:
receiving a compression coefficient for said second block of image data;
storing said compression coefficient for said second block of image data in a memory buffer, wherein said memory buffer includes a compression coefficient for a first block of image data;
generating a watermark;
combining said watermark with said compression coefficient for said second block of image data with said compression coefficients for said previous block of said first block of image data; and
generating a calculated binary value, wherein said calculated binary value is used to determine modifications to said second block of image data.

39. The method of claim 38, wherein said compression coefficients are DCT coefficients.

40. A computer program product tangibly embodied in a computer-readable storage medium, the computer program product including instructions that, when executed, perform operations for authenticating an origin of a digital image, said operations comprising:
receiving, at a computing device, an encrypted digital image with embedded digital watermark data provided by an imaging system according to claim 1; and
providing an authentication result as a display or a tangible output of said computing device as to whether or not said encrypted digital image originated from said imaging system, by:
(a) decrypting said encrypted digital image using a decryption algorithm; and
(b) determining whether or not said digital watermark data was embedded using said imaging system by deciphering said embedded digital watermark data in cooperation with a secret key used by said imaging system for embedding said digital watermark data;
wherein if said deciphering reveals that said digital watermark data was embedded using said secret key said digital image is authentic, and if said deciphering reveals that said digital watermark data was not embedded using said secret key, said digital image is not authentic.

* * * * *